United States Patent
Van Duren et al.

(10) Patent No.: US 9,105,527 B2
(45) Date of Patent: *Aug. 11, 2015

(54) HIGH PRODUCTIVITY COMBINATORIAL MATERIAL SCREENING FOR STABLE, HIGH-MOBILITY NON-SILICON THIN FILM TRANSISTORS

(71) Applicant: Intermolecular, Inc., San Jose, CA (US)

(72) Inventors: Jeroen Van Duren, Palo Alto, CA (US); Sang Lee, San Jose, CA (US); Minh Huu Le, San Jose, CA (US)

(73) Assignee: Intermolecular, Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/135,086

(22) Filed: Dec. 19, 2013

(65) Prior Publication Data

US 2015/0179684 A1  Jun. 25, 2015

(51) Int. Cl.
- *H01L 21/16* (2006.01)
- *H01L 27/12* (2006.01)
- *H01L 21/02* (2006.01)
- *H01L 21/465* (2006.01)
- *H01L 21/66* (2006.01)

(52) U.S. Cl.
CPC ...... *H01L 27/1259* (2013.01); *H01L 21/02565* (2013.01); *H01L 21/465* (2013.01); *H01L 22/10* (2013.01)

(58) Field of Classification Search
CPC ............ H01L 27/1225; H01L 21/02565; H01L 21/02554; H01L 27/3262; H01L 29/45; H01L 29/78693; H01L 21/0237; H01L 21/02403; H01L 21/02592; H01L 21/02631; H01L 21/30604; H01L 21/465; H01L 21/707; H01L 27/1262; H01L 29/66969; H01L 29/7869
USPC ................................................... 438/14, 104
See application file for complete search history.

(56) References Cited

U.S. PATENT DOCUMENTS

| | | | | |
|---|---|---|---|---|
| 7,682,882 B2* | 3/2010 | Ryu et al. | ...... | 438/149 |
| 8,466,465 B2* | 6/2013 | Jeong et al. | ...... | 257/59 |
| 2008/0158458 A1* | 7/2008 | Yang | ...... | 349/43 |
| 2008/0258141 A1* | 10/2008 | Park et al. | ...... | 257/43 |
| 2012/0074096 A1* | 3/2012 | Chiang et al. | ...... | 216/37 |

OTHER PUBLICATIONS

Robertson; High dielectric constant oxides; Dec. 2, 2004; The European Physical Journal Applied Physics; pp. 265-291.

Kamiya et al.; Present status of amorphous In—Ga—Zn—O thin-film transistors; Sep. 10, 2010; Science and Technology of Advanced Materials; IOP Publishing; National Institute for Materials Science; pp. 1-23.

(Continued)

*Primary Examiner* — Duy T Nguyen

(57) ABSTRACT

Methods for HPC techniques are applied to the processing of site-isolated regions (SIR) on a substrate to form at least a portion of a TFT device used in display applications. The processing may be applied to at least one of gate dielectric deposition, gate dielectric patterning, metal-based semiconductor deposition, metal-based patterning, etch stop deposition, etch stop patterning, source/drain deposition, or source/drain patterning. The SIRs may be defined during the deposition process with uniform deposition within each SIR or the SIRs may be defined subsequent to the deposition of layers wherein the layers are deposited with a gradient in one or more properties across the substrate.

20 Claims, 14 Drawing Sheets

(56) References Cited

OTHER PUBLICATIONS

Kwon et al.; Review Paper: Transparent Amorphous Oxide Semiconductor Thin Film Transistor; Mar. 27, 2011; Electronic Materials Letters, vol. 7, No. 1; Kim and Springer; pp. 1-11.

Park et al.; Review of recent developments in amorphous oxide semiconductor thin-film transistor devices; 2012; Thin Solid Films; Elsevier B.V.; pp. 1679-1693.

Ohta et al.; Frontier of transparent oxide semiconductors; 2003; Solid-State Electronics; Elsevier Ltd.; 2261-2267.

Hosono; Ionic amorphous oxide semiconductors: Material design, carrier transport, and device application; Apr. 3, 2006; Journal of Non-Crystalline Solids; Elsevier B.V.; pp. 851-858.

Iwasaki et al.; Combinatorial approach to thin-film transistors using multicomponent semiconductor channels: An application to amorphous oxide semiconductors in In—Ga—Zn—O system; Jun. 15, 2007; Applied Physics Letters; American Institute of Physics; pp. 242114-1-242114-3.

Ye et al.; High mobility amorphous zinc oxynitride semiconductor material for thin film transistors; Oct. 13, 2009; Journal of Applied Physics; American Institute of Physics; pp. 074512-1-074512-8.

Sundholm et al.; Passivation of Amorphous Oxide Semiconductors Utilizing a Zinc—Tin—Silicon—Oxide Barrier Layer; Jun. 2012; IEEE Electron Device Letters, vol. 33, No. 6; IEEE; pp. 836-838.

Nomura et al.; Stability and high-frequency operation of amorphous In—Ga—Zn—O thin-film transistors with various passivation layers; 2012; Thin Solid Films; Elsevier B.V.; pp. 3778-3782.

Shih et al.; Amorphous indium—gallium—zinc oxide thin-film transistors instability and stress evaluation by Stretched-Exponential model; May 5, 2012; Solid-State Electronics; Elsevier Ltd.; pp. 74-77.

Sasaki et al.; Conformal doping mechanism for fin field effect transistors by self-regulatory plasma doping with AsH3 plasma diluted with He; Jan. 11, 2012; Journal of Applied Physics; American Institute of Physics; pp. 013712-1-013712-6.

* cited by examiner

| Step | Conv | HPC |
|---|---|---|
| Gate electrode deposition | X | X |
| Gate electrode pattern | X | X |
| Gate dielectric deposition | X | X |
| Gate dielectric pattern | X | X |
| Metal oxide (XYZO) deposition | X | X |
| Metal oxide (XYZO) patterning | X | X |
| Etch stop deposition | X | X |
| Etch stop pattern | X | X |
| Source/Drain deposition | X | X |
| Source/Drain pattern | X | X |
| Passivation deposition | X | X |
| Passivation Patterning | X | X |
| Annealing | X | |

FIG. 7

| Variable | # of Levels |
|---|---|
| X/(X + Y + Zn) | 3 |
| Y/(X + Y + Zn) | 3 |
| Zn/(X + Y + Zn) | 3 |
| Substitute composition | 9 |
| Substitute concentration | 3 |
| Deposition power | 3 |
| Deposition pressure | 3 |
| Deposition gas composition | 3 |
| Anneal temperature | 3 |
| Anneal time | 3 |
| Anneal ambient | 3 |
| Composition gradient | 9 |

FIG. 8

| Step | Conv | HPC |
|---|---|---|
| Gate electrode deposition | X | X |
| Gate electrode pattern | X | X |
| Gate dielectric deposition | X | X |
| Gate dielectric pattern | X | X |
| Metal oxide (XYZO) deposition | X | X |
| Metal oxide (XYZO) patterning | X | X |
| Source/Drain deposition | X | X |
| Source/Drain pattern | X | X |
| Passivation deposition | X | X |
| Passivation Patterning | X | |
| Annealing | X | |

FIG. 11

| Variable | # of Levels |
|---|---|
| X/(X + Y + Zn) | 3 |
| Y/(X + Y + Zn) | 3 |
| Zn/(X + Y + Zn) | 3 |
| Substitute composition | 9 |
| Substitute concentration | 3 |
| Deposition power | 3 |
| Deposition pressure | 3 |
| Deposition gas composition | 3 |
| Anneal temperature | 3 |
| Anneal time | 3 |
| Anneal ambient | 3 |
| Composition gradient | 9 |

FIG. 12

Process at least a first site-isolated region on a substrate using a first set of process parameters, wherein the processing is used in the formation of at least a portion of a metal oxide TFT device
1302

Process at least a second site-isolated region on the substrate using a second set of process parameters, wherein the processing is used in the formation of at least a portion of a metal oxide TFT device
1304

Evaluate the results of the processing of the first site-isolate region and the processing of the second site-isolated region
1306

FIG. 13

1400 

Process a substrate, wherein the processing is used to deposit a material on a substrate with a gradient in at least one of the material properties in at least one direction across the substrate
1402

Define site-isolated regions on the substrate by removing the material between the site-isolated regions
1404

Evaluate the results of the processing in each of the site-isolated regions
1406

FIG. 14

HIGH PRODUCTIVITY COMBINATORIAL MATERIAL SCREENING FOR STABLE, HIGH-MOBILITY NON-SILICON THIN FILM TRANSISTORS

TECHNICAL FIELD

The present disclosure relates generally to methods of screening materials for use in metal-based thin film transistors (TFTs) used in display applications.

BACKGROUND

TFTs are employed as switching and/or driving devices in many electronic circuits. As an example, TFTs are used as control devices for pixels in display applications such as flat panel displays (FPD), whether based on active-matrix-liquid-crystal displays (AMLCD), or active-matrix-organic-light-emitting-displays (AMOLED). These FPD are used in televisions, computer monitors, smart phones, tablets, etc. Traditionally, TFTs based on amorphous silicon technology (a-Si) have been used due to the low cost and ease of manufacture. However, a-Si-based TFTs have a number of issues such as low mobility, low ON/OFF current ratios (e.g. higher power), and limited durability. Additionally, TFTs based on a-Si are not transparent, thereby limiting the size of the TFT within the pixel so that the display characteristics are not compromised. With the market moving to higher resolution, higher refresh rate, lower power consumption, lower cost, and larger displays, there is a need to replace a-Si.

Metal-based semiconductor materials (e.g. metal oxides, metal oxy-nitrides, metal oxy-chalcogenides, metal chalcogenides) are candidates for replacing a-Si in display applications. The metal-based semiconductor materials may be amorphous, crystalline, or polycrystalline. Some examples of metal-based semiconductor materials include those based on In—Ga—Zn—O (IGZO) and related materials, like In—Zn—O (IZO), Zn—Sn—O (ZTO), Hf—In—Zn—O (HIZO), and Al—Zn—Sn—O (AZTO). Some examples of metal oxy-nitrides include Zn—O—N(ZnON), In—O—N (InON), Sn—O—N(SnON). Examples of crystalline metal-based semiconductor materials include c-axis aligned crystalline (CAAC) materials like CAAC-IGZO, or polycrystalline materials like ZnO and In—Ga—O (IGO). In addition to the application of these materials into TFTs, these materials are also being considered for memory (e.g. non-volatile random access memory (RAM)), sensor applications (e.g. image sensors), and central processing units (CPU). Some of these materials exhibit stable amorphous phases, high mobility (e.g. >5 cm$^2$/Vs), low threshold voltage (close to zero, e.g. in a range of −1.0V to +2.0V), low carrier concentrations (e.g. $10^{16}$-$10^{17}$ cm$^{-3}$), high ON/OFF current ratios (e.g. >$10^6$), and high durability (e.g. negative bias temperature illumination stress NBTIS with threshold voltage shift in a range of −1.5V to +0.5V). However, since these materials are multinary compounds (e.g. three or more elements), their performance and properties are sensitive to factors such as composition, concentration gradients, deposition parameters, post-deposition treatments, interactions with adjacent materials, and the like. Further, since the electrical, physical, and chemical behavior of these materials is difficult or impossible to model, much of the development and optimization must be accomplished empirically. Comprehensive evaluation of the entire composition range and deposition parameter space for the formation of a TFT device utilizing these materials requires thousands or millions of experiments.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments, High Productivity Combinatorial (HPC) techniques are applied to the processing of site-isolated regions (SIR) on a substrate to form at least a portion of a TFT device used in display applications. The processing may be applied to at least one of adhesion layer deposition, diffusion barrier layer deposition, gate metal deposition, gate metal patterning, gate dielectric deposition, gate dielectric patterning, metal-based semiconductor deposition, metal-based semiconductor patterning, etch stop deposition, etch stop patterning, source/drain deposition, source/drain patterning, passivation layer deposition, passivation layer patterning, or a wet/dry surface treatment. In some embodiments, the metal-based semiconductor material includes earth abundant elements. In some embodiments, the metal-based semiconductor material is replaced with one or more of a metal nitride material, a metal sulphide material, a metal selenide material, or mixtures thereof.

In some embodiments, HPC techniques are applied to the processing of site-isolated regions (SIR) on a substrate to form at least a portion of a TFT device used in display applications. In some embodiments, materials are deposited on a substrate such that a gradient in at least one of the material properties of the material is formed in at least one direction (e.g. length or width) across the substrate. In some embodiments, the gradient is formed in both directions (e.g. length and width) across the substrate. Examples of material properties that can be varied across the substrate include composition, thickness, resistivity, optical properties, crystal orientation, and the like. The processing may be applied to at least one of adhesion layer deposition, diffusion barrier layer deposition, gate metal layer deposition, gate dielectric deposition, metal-based semiconductor deposition, etch stop deposition, source/drain deposition, or passivation layer deposition.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 7 is a table illustrating some of the manufacturing steps that can be investigated using HPC techniques.

FIG. 8 is a table illustrating some of the processing variables that can be investigated using HPC techniques.

FIG. 11 is a table illustrating some of the manufacturing steps that can be investigated using HPC techniques.

FIG. 12 is a table illustrating some of the processing variables that can be investigated using HPC techniques.

FIG. 13 is a flow chart illustrating the steps of a method according to some embodiments.

FIG. 14 is a flow chart illustrating the steps of a method according to some embodiments.

DETAILED DESCRIPTION

Figure 1:
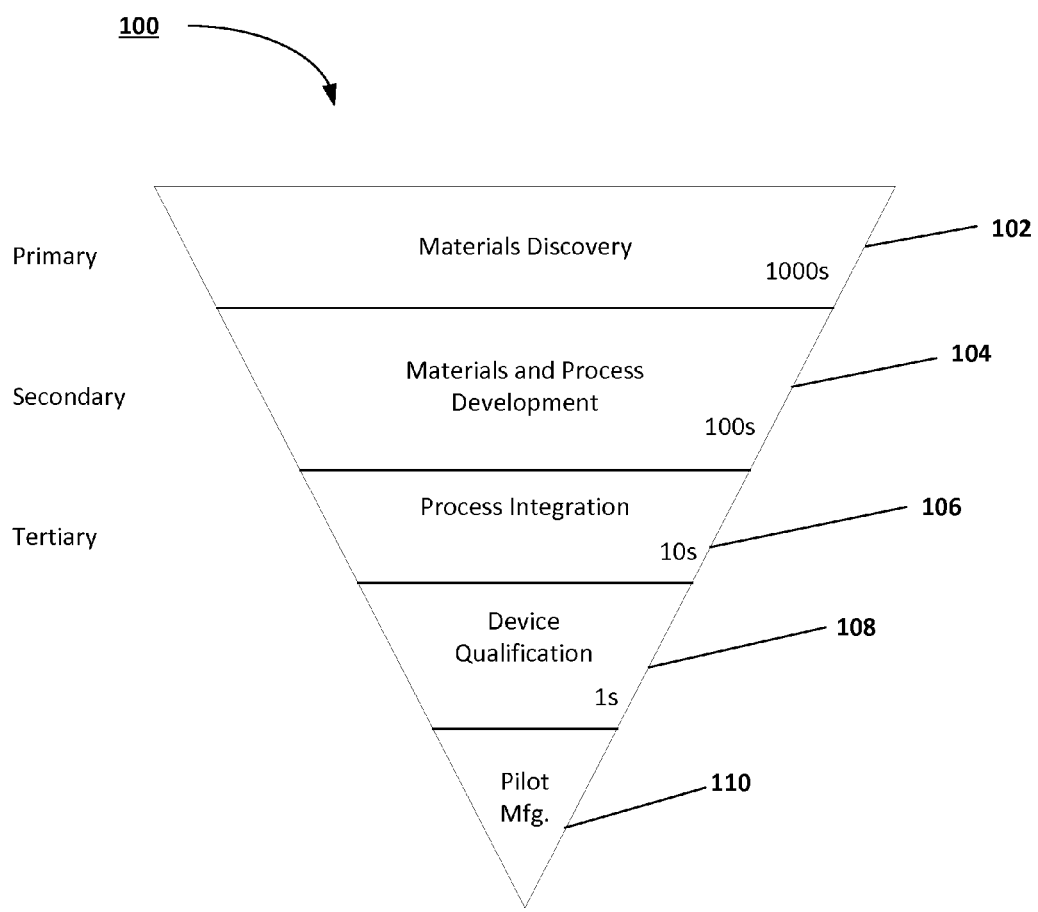
FIG. 1 is a schematic diagram for implementing combinatorial processing and evaluation.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

It must be noted that as used herein and in the claims, the singular forms "a," "and" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. Where the modifier "about" or "approximately" is used, the stated quantity can vary by up to 10%. Where the modifier "substantially equal to" or "substantially the same" is used, the two quantities may vary from each other by no more than 5%.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

As used herein, a material (e.g. a dielectric material or an electrode material) will be considered to be "crystalline" if it exhibits greater than or equal to 30% crystallinity as measured by a technique such as x-ray diffraction (XRD).

As used herein, the term "earth-abundant elements" refers to elements that are relatively abundant in the Earth's crust. These elements include Al, Ba, C, Ca, Cr, Cu, Fe, K, Mg, Mn, Mo, Na, Ni, Si, Sn, Sr, Ti, V, W, Zn, and Zr and tuning or grading elements such as Ag, Al, Ba, C, Ca, Cl, Cr, Cu, F, Fe, Ge, K, O, Se, Si, Mg, Mn, Mo, N, Na, Ni, O, P, Pb, S, Sn, Sr, Ti, V, W, Zn, and Zr. TFTs may include semiconducting materials made from these elements.

As used herein, the term "IGZO-like materials" refers to materials wherein at least part of the In and/or Ga in IGZO has been replaced by one or more earth abundant elements such as Al, Ba, C, Ca, Cr, Cu, Fe, K, Mg, Mn, Mo, Na, Ni, Si, Sn, Sr, Ti, V, W, Zn, and Zr. The abbreviation "[X][Y]ZO" will be used herein to designate these IGZO-like materials where [X] and [Y] are each one or more of Al, Ba, C, Ca, Cr, Cu, Fe, K, Mg, Mn, Mo, Na, Ni, Si, Sn, Sr, Ti, V, W, Zn, and Zr and replace at least part of the In and/or Ga in IGZO.

Those skilled in the art will appreciate that each of the layers discussed herein and used in the TFT may be formed using any common formation technique such as physical vapor deposition (PVD), atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), pulsed laser deposition (PLD), or evaporation. Generally, because of the structure and size of the display devices, PVD or PECVD are preferred methods of formation. However, any of these techniques are suitable for forming each of the various layers discussed herein. Those skilled in the art will appreciate that the teachings described herein are not limited by the technology used for the deposition process.

Figure 5:
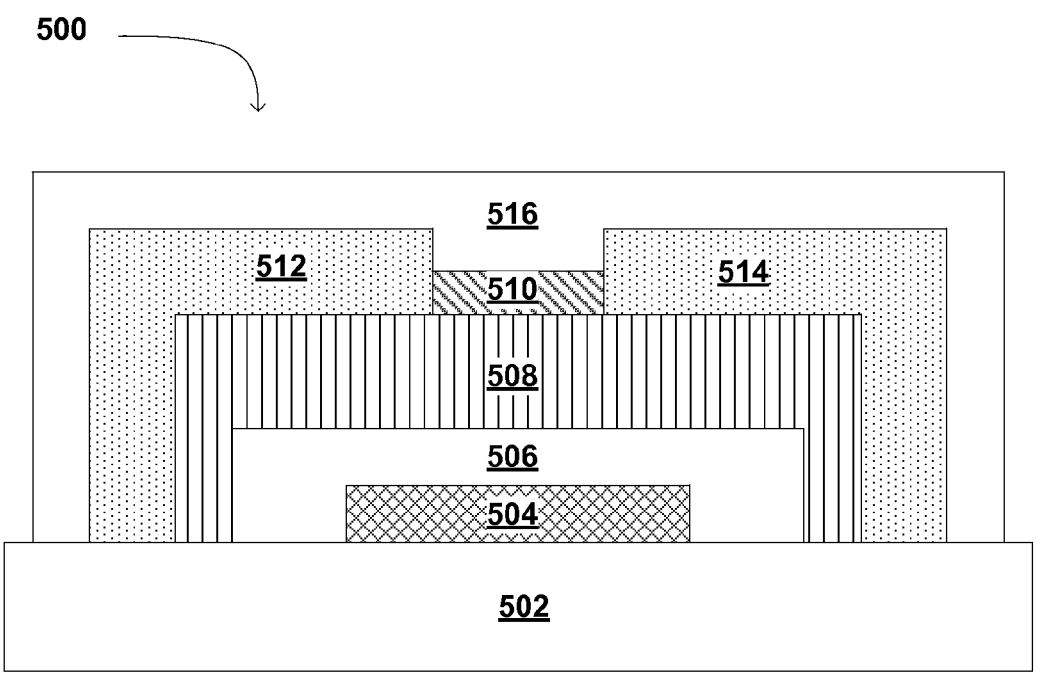
FIG. 5 is a simplified cross-sectional view of a TFT according to some embodiments.
Figure 9:
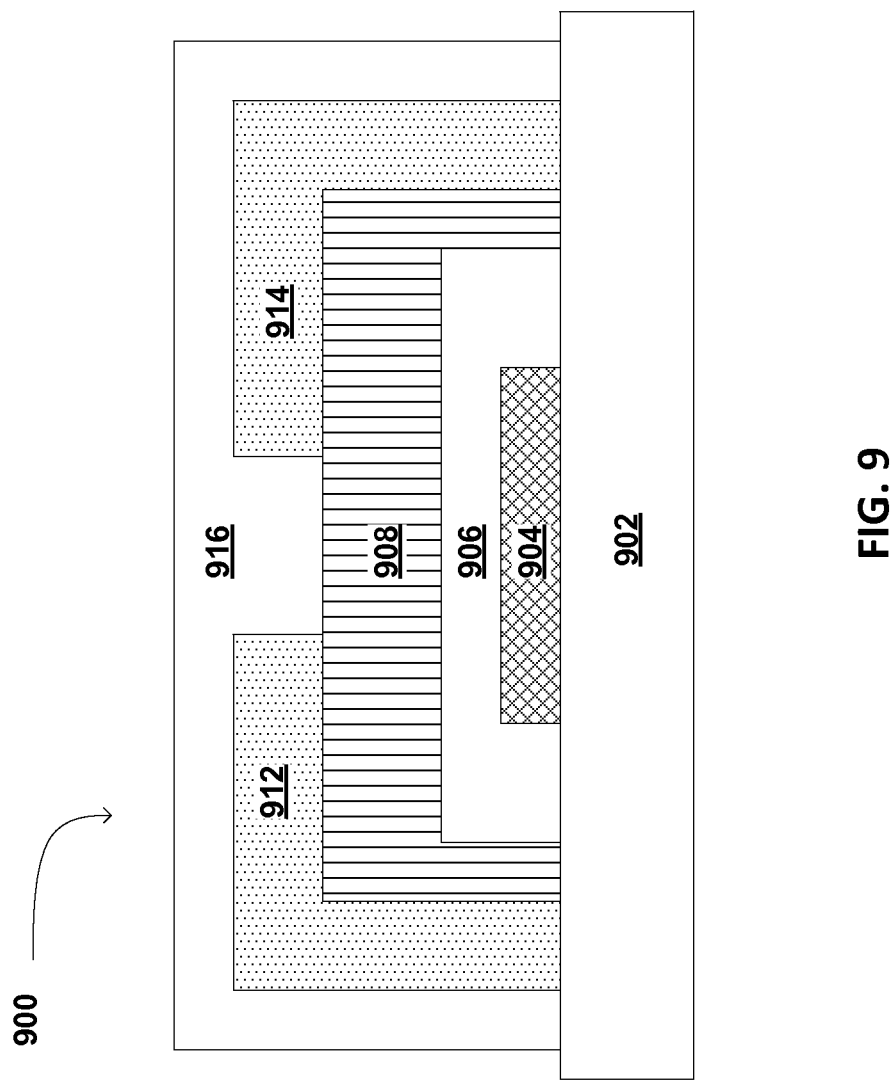
FIG. 9 is a simplified cross-sectional view of a TFT according to some embodiments.

In FIGS. 5 and 9, a TFT stack is illustrated using a simple inverted-staggered, bottom-gate, with etch-stopper island, device structure. Those skilled in the art will appreciate that the description and teachings herein can be readily applied to any simple or complex TFT structure, including inverted-staggered, bottom-gate, back-channel-etch device structures, co-planar device structures, inverted-staggered, bottom-gate, etch-stopper contact (via) hole device structures, self-aligned, inverted-staggered, bottom-gate, etch-stopper island device structures, and various device structures based on top-gate, bottom-gate, staggered, inverted-staggered, co-planar, back-channel-etch, single-gate, or double-gate features. The drawings are for illustrative purposes only and do not limit the application of the present disclosure As used herein, the phrase "site-isolated region" (SIR) will be understood to refer to one or more regions on a substrate that are separated and used for the evaluation of different materials or process parameters. The SIRs can be formed using many different methods such as scribing, deposition through a shadow mask, deposition using isolated deposition heads, lithography, and the like. The present disclosure is not limited by the method used to form the SIRs.

As used herein, the notation "(IIIA)" will be understood to represent the sum of the concentrations of all Group-IIIA elements. This notation will be used herein in calculations of the composition ratios of various elements. This notation will be understood to extend to each of the other Groups of the periodic table respectively (e.g. "(IA)", "(IIA)", "(IVA)", "(VIA)", "(IB)", "(IIB)", etc.).

As used herein, the notation "In—Ga—Zn—O" will be understood to include a material containing these elements in any ratio. This notation will be shortened to "IGZO" for brevity. Where a specific composition is discussed, the atomic concentrations (or ranges) will be provided. The notation is extendable to other materials and other elemental combinations.

As used herein, the notation "$In_xGa_yZn_zO_w$" will be understood to include a material containing these elements in a specific ratio given by x, y, z, and w (e.g. $In_{33}Ga_{33}Zn_{33}$ contains 33 atomic % In, 33 atomic % Ga, and 33 atomic % Zn). The notation is extendable to other materials and other elemental combinations.

As used herein, the notation "$(In,Ga)_x(Zn,Cd)_y(O,Se,S,Te)_z$" will be understood to include a material containing a total amount of Group-IIA elements (i.e. In plus Ga, etc.) in a ratio given by "x", a total amount of Group-IIB elements (i.e. Zn plus Cd, etc.), etc. in a ratio given by "y", and a total amount of Group-VIA elements (i.e. O plus Se plus S plus Te, etc.) in a ratio given by "z". The notation is extendable to other materials and other elemental combinations.

As used herein, the terms "film" and "layer" will be understood to represent a portion of a stack. They will be understood to cover both a single layer as well as a multilayered structure (i.e. a nanolaminate). As used herein, these terms will be used synonymously and will be considered equivalent.

As used herein, "substrate" will be understood to generally be one of float glass, low-iron glass, borosilicate glass, display glass, alkaline earth boro-aluminosilicate glass, fusion drawn glass, flexible glass, specialty glass for high temperature processing, polyimide, plastics, polyethylene terephthalate (PET), etc. for either applications requiring transparent or non-transparent substrate functionality. For substrates with no need for transparency, substrates like aluminum foil, stainless steel, carbon steel, paper, cladded foils, etc. can be utilized.

The typical materials in a TFT stack consist of a substrate, a diffusion barrier layer, a gate electrode, source electrode, drain electrode, gate insulator, and a semiconducting channel layer, in addition to an optional etch stopper and/or passivation layer. As used herein, "metal-based semiconductor layer", and "metal-based semiconductor material", etc. will be understood to be equivalent and be understood to refer to a layer and/or material related to the channel layer. This disclosure will describe methods and apparatus for forming and evaluating at least portions of TFT devices based on metal-based semiconductor materials. The metal-based semiconductor materials may include at least one of metal oxides, metal oxy-nitrides, metal oxy-chalcogenides, or metal chalcogenides. In—Ga—Zn—O (IGZO), will be used as an example of a metal-based semiconductor material for purposes of illustration, but this is not intended to be limiting. Those skilled in the art will understand that the present disclosure can be applied to any suitable metal-based semiconductor material applicable to TFT devices.

The manufacture of semiconductor devices (e.g. TFT displays) entails the integration and sequencing of many unit processing steps. As an example, semiconductor manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as semiconductor devices. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009, the entireties of which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005, the entireties of which are all herein incorporated by reference.

HPC processing techniques have been successfully adapted to wet chemical processing such as etching, texturing, polishing, cleaning, etc. HPC processing techniques have also been successfully adapted to deposition processes such as physical vapor deposition (PVD), atomic layer deposition (ALD), and chemical vapor deposition (CVD).

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

Figure 2:
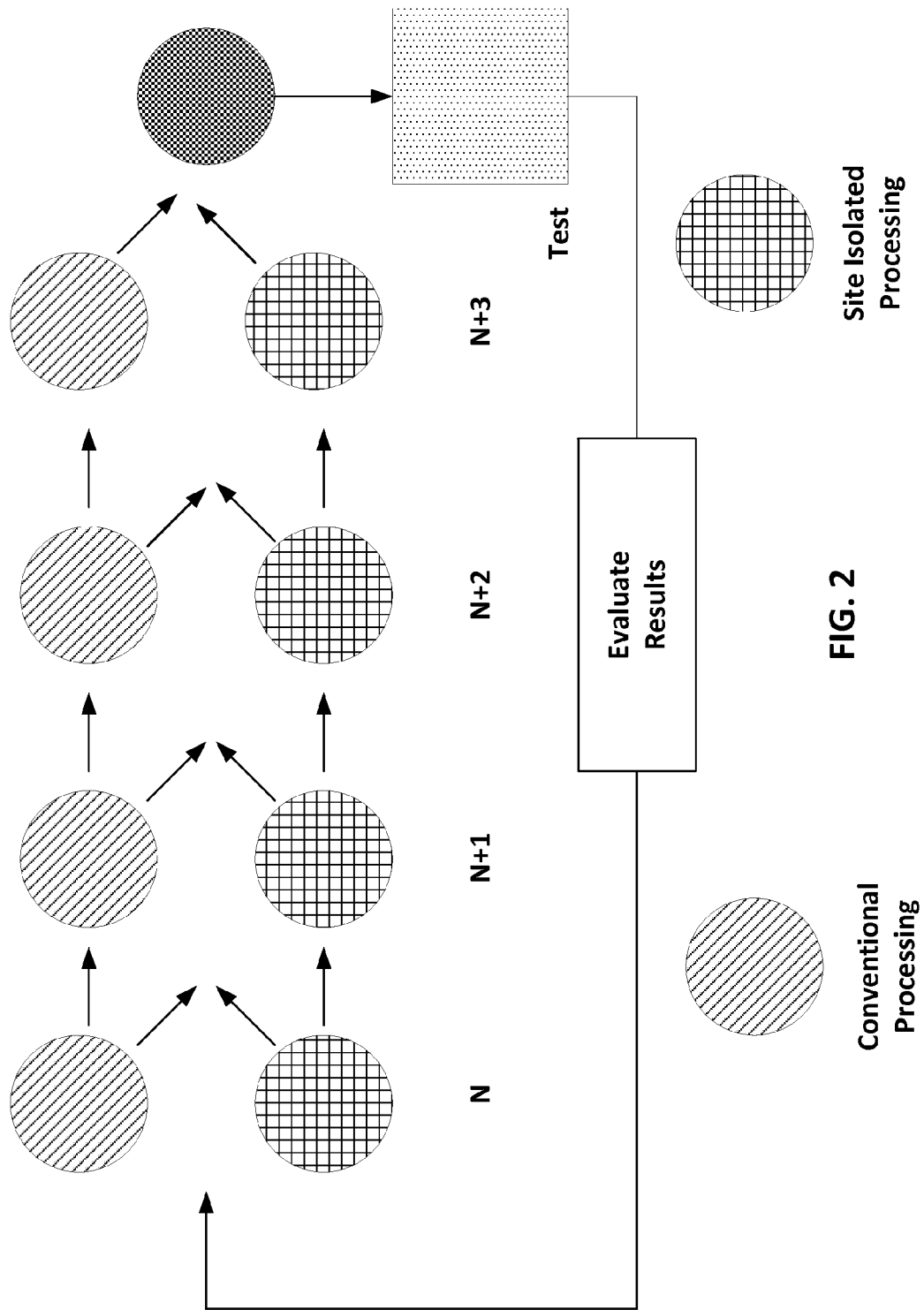
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It will be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It will be appreciated that these process parameters are exemplary and not meant to be an exhaustive list as other process parameters commonly used in semiconductor manufacturing may be varied.

Figure 3:
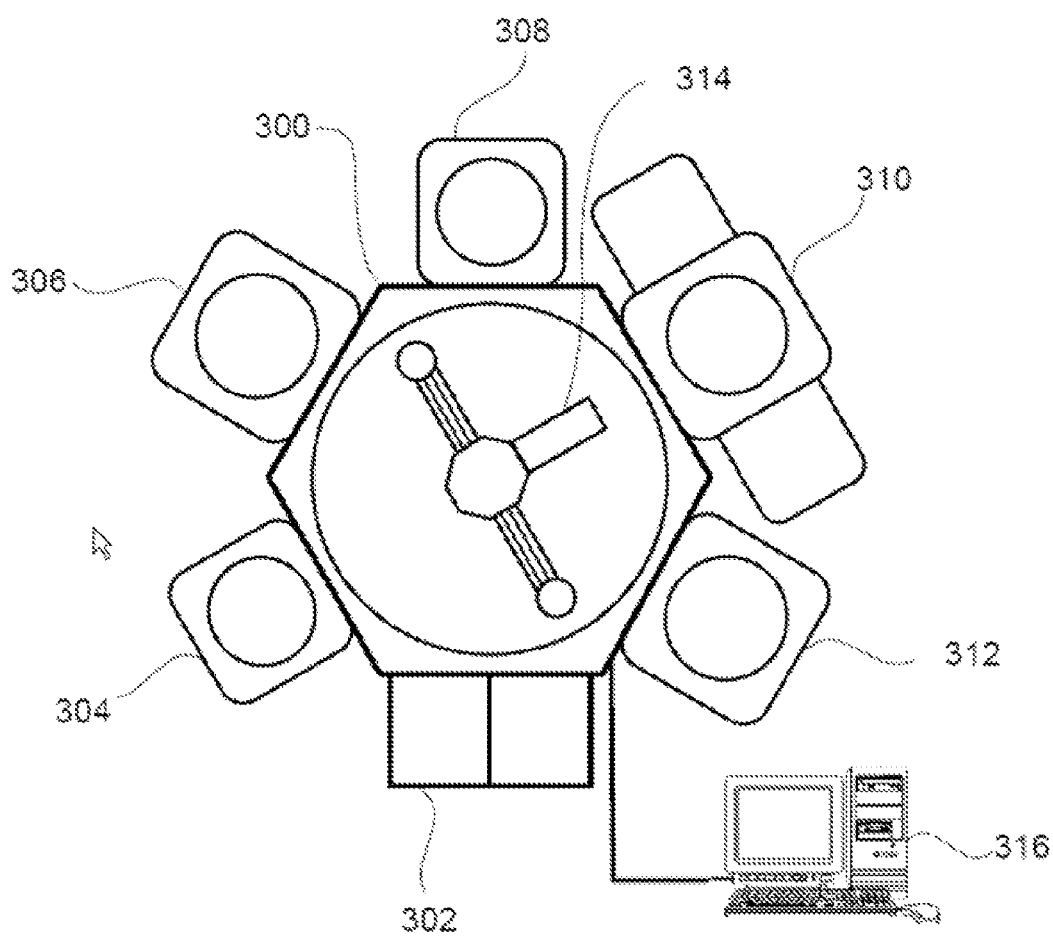
FIG. 3 is a simplified schematic diagram illustrating an integrated high productivity combinatorial (HPC) system.

FIG. 3 is a simplified schematic diagram illustrating an integrated high productivity combinatorial (HPC) system in accordance with some embodiments of the invention. The HPC system includes a frame 300 supporting a plurality of processing modules. It will be appreciated that frame 300 may be a unitary frame in accordance with some embodiments. In some embodiments, the environment within frame 300 is controlled. A load lock 302 provides access into the plurality of modules of the HPC system. A robot 314 provides for the movement of substrates (and masks) between the modules and for the movement into and out of the load lock 302. Modules 304-312 may be any set of modules and preferably include one or more combinatorial modules. For example, module 304 may be an orientation/degassing module, module 306 may be a clean module, either plasma or non-plasma based, modules 308 and/or 310 may be combinatorial/conventional dual purpose modules. Module 312 may provide conventional clean or degas as necessary for the experiment design.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device 316, may control the processes of the HPC system. Further details of one possible HPC system are described in U.S. application Ser. Nos. 11/672,478 and 11/672,473, the entire disclosures of which are herein incorporated by reference. In a HPC system, a plurality of methods may be employed to deposit material upon a substrate employing combinatorial processes.

In some embodiments, a process chamber for combinatorial processing of a substrate is provided that includes one or more assemblies for sputtering material from targets (such as sputter guns); a power source coupled to the one or more sputter guns; a substrate support; a power source (e.g. RF, DC, pulsed, or the like) coupled to the substrate support; and a grounded shield comprising an aperture disposed between the substrate support and the one or more sputter guns to form a dark-space gap between the substrate support and the aperture. The aperture may be configured to allow sputter deposition or plasma processing of a site-isolated region on the substrate.

The process chamber may further include a plasma confinement ring between the substrate support and the grounded shield. The plasma confinement ring may be thicker than the substrate. The plasma confinement ring fills the dark-space gap between the substrate support and the grounded shield.

The process chamber may further include a dielectric material in the dark-space gap. The dielectric material may be coated with a metal layer for grounding and RF shielding. The dark-space gap may be between about 1 mm and about 3 mm.

The process chamber may further include a controller to selectively apply power to the one or more sputter guns from the power source and apply power to bias the substrate support from a power source. The controller may be configured to control the power source to perform one or both of plasma processing and PVD deposition on a site-isolated region on the substrate. In some embodiments, other sputter mechanisms can be used instead of the sputter guns.

In some embodiments, a semiconductor processing system for combinatorial processing of a substrate is provided that includes a process chamber having a dark-space region configured to prevent plasma leaks in a region adjacent the substrate. The process chamber can be configured to perform both plasma processing and sputter deposition on a site-isolated region on the substrate. The process chamber may include a dielectric material in the dark-space gap. The dark-space region may be between about 1 mm and about 3 mm.

The process chamber may include a plasma confinement ring positioned around the substrate to prevent plasma leak in a region adjacent the substrate. The plasma confinement ring may be thicker than the substrate. The plasma confinement ring may be a conductive material or ceramic material which may or may not be partially coated with a metal layer.

In some embodiments, a method of combinatorial processing of a substrate is provided in which site-isolated sputter deposition and plasma processing are performed in the same process chamber. The site-isolated sputter deposition may include site-isolated co-sputtering deposition. Cleaning, site-isolated sputter deposition, and plasma processing may be performed in the same process chamber. Cleaning, site-isolated sputter deposition, and plasma processing, and full wafer sputter deposition may be performed in the same process chamber.

In some embodiments, a method of combinatorial processing of a substrate is provided in which sputter deposition and plasma processing are performed in the same process chamber. The sputter deposition may include co-sputtering deposition. Cleaning, sputter deposition, and plasma processing may be performed in the same process chamber. The sputter deposition may result in a gradient in material properties across the length and/or width of the substrate. Physical methods such as scribing or lithography may be used to define the SIRs after the deposition.

Figure 4:
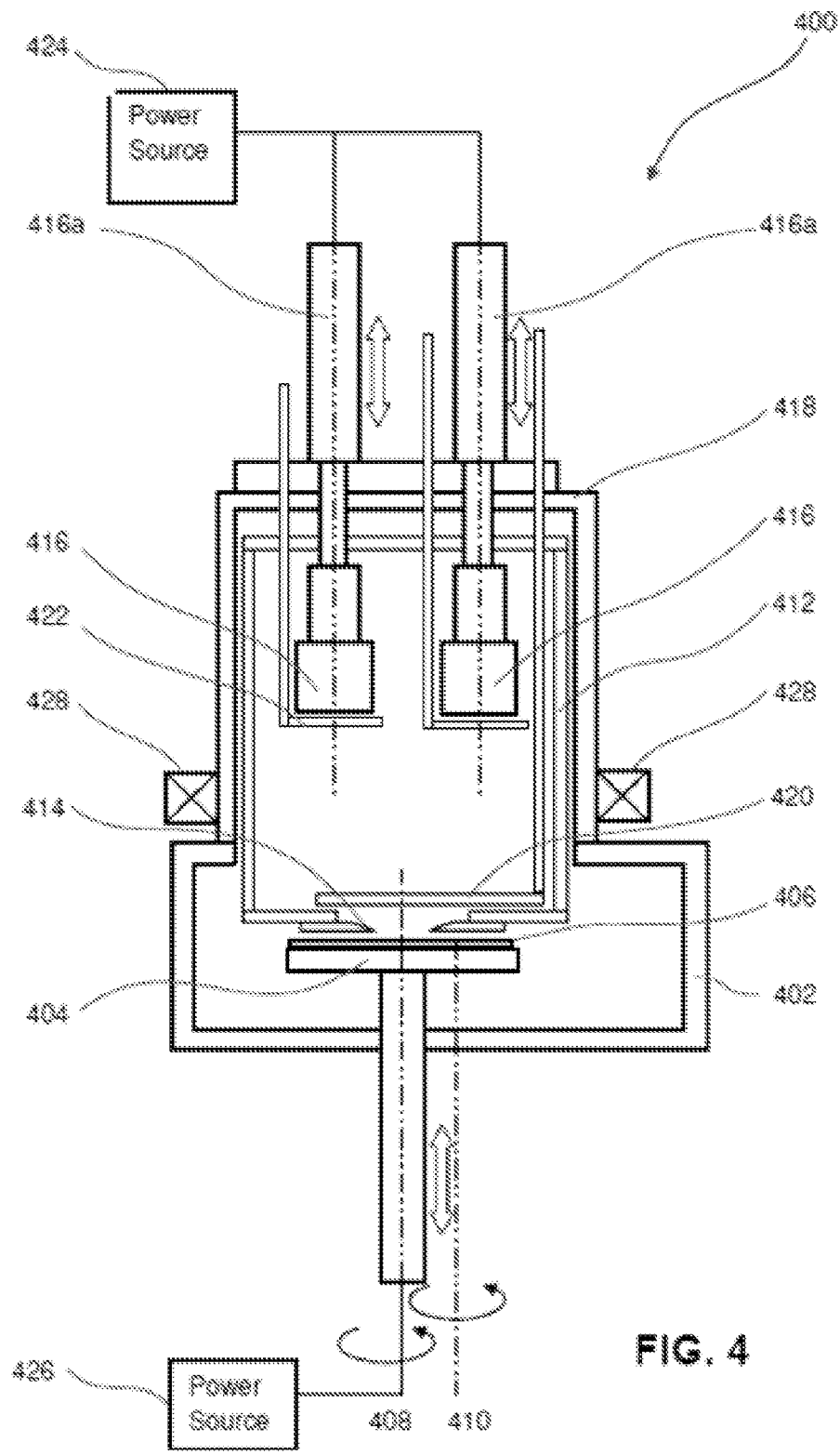
FIG. 4 is a simplified schematic diagram illustrating an exemplary sputter processing chamber according to some embodiments.

FIG. 4 is a simplified schematic diagram illustrating an exemplary process chamber 400 configured to perform combinatorial processing and full substrate processing in accordance with some embodiments of the invention. It will be appreciated that the processing chamber shown in FIG. 4 is merely exemplary and that other process or deposition chambers may be used with the invention. Further details on exemplary deposition chambers that can be used with the invention can be found in U.S. patent application Ser. No. 11/965,689, now U.S. Pat. No. 8,039,052, entitled "Multi-region Processing System and Heads", filed Dec. 27, 2007, and claiming priority to U.S. Provisional Application No. 60/970,500 filed on Sep. 6, 2007, and U.S. patent application Ser. No. 12/027,980, entitled "Combinatorial Process System", filed Feb. 7, 2008 and claiming priority to U.S. Provisional Application No. 60/969,955 filed on Sep. 5, 2007, the entireties of which are hereby incorporated by reference.

The processing chamber 400 includes a bottom chamber portion 402 disposed under a top chamber portion 418. A substrate support 404 is provided within the bottom chamber portion 402. The substrate support 404 is configured to hold a substrate 406 disposed thereon and can be any known substrate support, including but not limited to a vacuum chuck, electrostatic chuck or other known mechanisms.

The substrate 406 may be a conventional 200 mm and 300 mm wafers, or any other larger or smaller size. In some embodiments, substrate 406 may be a square, rectangular, or other shaped substrate. The substrate 406 may be a blanket substrate, a coupon (e.g., partial wafer), or even a patterned substrate having predefined regions. In some embodiments, substrate 406 may have regions defined through site-isolated processing as described herein.

The top chamber portion 418 of the chamber 400 includes a process kit shield 412, which defines a confinement region over a portion of the substrate 406. As shown in FIG. 4, the process kit shield 412 includes a sleeve having a base (optionally integrated with the shield) and an optional top. It will be appreciated, however, that the process kit shield 412 may have other configurations. The process kit shield 412 is configured to confine plasma generated in the chamber 400 by sputter guns 416. The positively-charged ions in the plasma strike a target and dislodge atoms from the target. The sputtered neutrals are deposited on an exposed surface of substrate 406. In some embodiments, the process kit shield 412 may be partially moved in and out of chamber 400, and, in other embodiments, the process kit shield 412 remains in the chamber for both full substrate and combinatorial processing. When used in the full substrate configuration, a gradient in the material properties can be introduced across the length and/or width of the substrate.

The base of process kit shield 412 includes an aperture 414 through which a surface of substrate 406 is exposed for deposition processing. The chamber may also include an aperture shutter 420 which is moveably disposed over the base of process kit shield 412. The aperture shutter 420 slides across a bottom surface of the base of process kit shield 412 in order to cover or expose aperture 414. In some embodiments, the aperture shutter 420 is controlled by an arm extension (not shown) which moves the aperture shutter to expose or cover aperture 414.

As shown in FIG. 4, the chamber 400 includes two sputter guns 416. While two sputter guns are illustrated, any number of sputter guns may be included, e.g., one, three, four or more sputter guns may be included. Where more than one sputter gun is included, the plurality of sputter guns may be referred to as a cluster of sputter guns. In addition, other sputter systems can be used, such as magnetron sputter systems.

The sputter guns 416 are moveable in a vertical direction so that one or both of the guns may be lifted from the slots of the shield. In some embodiments, sputter guns 416 are oriented or angled so that a normal reference line extending from a planar surface of the target of the process gun is directed toward an outer periphery of the substrate in order to achieve good uniformity for full substrate deposition film. The target/ gun tilt angle depends on the target size, target-to-substrate spacing, target material, process power/pressure, etc. and the tilt angle may be varied.

The chamber may also include a gun shutter 422, which seals off the deposition gun when the process gun 416 is not needed during processing. The gun shutter 422 allows one or more of the sputter guns 416 to be isolated from certain processes as needed. It will be appreciated that the gun shutter 422 may be integrated with the top of the process kit shield 412 to cover the opening as the process gun 416 is lifted or individual gun shutter 422 can be used for each process gun 416.

The sputter guns 416 may be fixed to arm extensions 416a to vertically move sputter guns 416 toward or away from top chamber portion 418. The arm extensions 416a may be attached to a drive, e.g., lead screw, worm gear, etc. The arm extensions 416a may be pivotally affixed to sputter guns 416 to enable the sputter guns to tilt relative to a vertical axis. In some embodiments, sputter guns 416 tilt toward aperture 414 when performing combinatorial processing and tilt toward a periphery of the substrate being processed when performing full substrate processing. It will be appreciated that sputter guns 416 may alternatively tilt away from aperture 414.

The chamber 400 also includes power sources 424 and 426. Power source 424 provides power for sputter guns 416, and power source 426 provides RF power to bias the substrate support 404. In some embodiments, the output of the power source 426 is synchronized with the output of power source 424. The power source, 424, may output a direct current (DC) power supply, a direct current (DC) pulsed power supply, a radio frequency (RF) power supply or a DC-RF imposed power supply. The power sources 424 and 426 may be controlled by a controller (not shown) so that both deposition and etch can be performed in the chamber 400, as will be described in further detail hereinafter.

The chamber 400 may also include an auxiliary magnet 428 disposed around an external periphery of the chamber 400. The auxiliary magnet 428 is located between the bottom surface of sputter guns 416 and proximity of a substrate support 404. The auxiliary magnet may be positioned proximate to the substrate support 404, or, alternatively, integrated within the substrate support 404. The magnet 428 may be a permanent magnet or an electromagnet. In some embodiments, the auxiliary magnet 428 improves ion guidance as the magnetic field above substrate 406 is re-distributed or optimized to guide the metal ions. In some other embodiments, the auxiliary magnet 428 provides more uniform bombardment of ions and electrons to the substrate and improves the uniformity of the film being deposited.

The substrate support 404 is capable of both rotating around its own central axis 408 (referred to as "rotation" axis), and rotating around an exterior axis 410 (referred to as "revolution" axis). Such dual rotary substrate supports can be advantageous for combinatorial processing using site-isolated mechanisms. Other substrate supports, such as an XY table, can also be used for site-isolated deposition. In addition, substrate support 404 may move in a vertical direction. It will be appreciated that the rotation and movement in the vertical direction may be achieved through one or more known drive mechanisms, including, for example, magnetic drives, linear drives, worm screws, lead screws, differentially pumped rotary feeds, and the like.

Through the rotational movement of the process kit shield 412 and the corresponding aperture 414 in the base of the process kit shield, in combination with the rotational movement of substrate support 404, any region of a substrate 406 may be accessed for combinatorial processing. The dual rotary substrate support 404 allows any region (i.e., location or site) of the substrate 406 to be placed under the aperture 414; hence, site-isolated processing is possible at any location on the substrate 406. It will be appreciated that removal of the aperture 414 and aperture shutter 420 from the chamber 400 or away from the substrate 406 and enlarging the bottom opening of the process kit shield 412 allows for processing of the full substrate.

As described above, embodiments of the invention allow for both sputter deposition and plasma etch to be performed in the same process chamber (e.g., chamber 400). In some embodiments of the invention, the chamber 400 is configured so that both sputter deposition and plasma etch can be performed in the chamber 400, and, in particular, the chamber 400 is configured to allow for both site-isolated sputter deposition and plasma etch to be performed in the chamber. It will be appreciated that full wafer sputter deposition and plasma etch may also be performed in the chamber 400 by removing the aperture 414 away from the chamber 400 or moving the aperture 414 away from the substrate 406 and enlarging the bottom opening of the process kit shield 412.

In particular, plasma etch may be performed in the chamber 400 by applying RF power from the power source 426 to bias the substrate support (e.g., an electrostatic chuck) 404 with or without DC plasma near the sputter target. Plasma is then ignited on top of the substrate 406, which is confined by the aperture 414 and shield 412 above the substrate 406 so that site-isolated plasma etch of the substrate 406 can occur in the chamber 400. Sputter deposition may similarly be performed in the chamber 400 by applying DC power from the power source 424 to the sputter gun(s) 416. Three modes of processing can be performed in chamber 400: sputter deposition only, simultaneous sputter deposition and plasma etch, and plasma etch only.

In one embodiment, the RF power is any value or range of values between about 50 W and about 2000 W. In some embodiments, DC or pulsed DC power applied to sputter sources can have peak powers as high as 10 kW, for example, for high metal ionization in sputter deposition. The RF power frequency may be any value or range of values between about 40 kHz and about 60 MHz. It will be appreciated that the RF power frequency may be less than about 40 kHz or greater than about 60 MHz.

In chamber 400, plasma etch can be used to clean the substrate 406. An exemplary process according to some embodiments of the invention may begin by cleaning the substrate, performing site-isolated sputter deposition, performing site-isolated plasma etch, performing full substrate sputter deposition and then performing a subsequent full substrate plasma etch, all within the same chamber (e.g., chamber 400). Another exemplary process according to some embodiments of the invention may begin by cleaning the substrate, performing a full substrate sputter deposition, performing site-isolated sputter deposition, performing site-isolated plasma etch, performing full substrate sputter deposition, and performing a subsequent full substrate plasma etch, all within the same chamber (e.g., chamber 400). It will be appreciated that the above processes are merely exemplary and that processes according to the invention may include fewer steps or additional steps and that the order of the steps may vary.

FIG. 5 is a simplified cross-sectional view of a TFT according to some embodiments. Bottom gate electrode, 504, is formed above substrate, 502. As discussed previously, the substrate may be any commonly used substrate for display devices such as one of float glass, low-iron glass, borosilicate glass, display glass, alkaline earth boro-aluminosilicate glass, fusion drawn glass, flexible glass, specialty glass for high temperature processing, polyimide, plastics, PET, etc. for either applications requiring transparent or non-transparent substrate functionality. For substrates with no need for transparency, substrates like aluminum foil, stainless steel, carbon steel, paper, cladded foils, etc. can be utilized. The substrate optionally is covered by a diffusion barrier, (e.g. silicon oxide, silicon nitride, or silicon oxy-nitride). The bottom gate electrode, 504, is typically formed by a deposition process followed by a patterning process. Optionally, an anneal step is implemented prior to patterning, post patterning, or both. A typical deposition method involves sputter deposition. Patterning is typically performed by photolithography. The photolithography most commonly relies on wet etching, yet dry etching (e.g. reactive ion etching) can be used as well. Wet etch chemistries are most commonly aqueous, and include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. The gate electrode is most commonly a stack of two or more layers. Examples of suitable materials for the bottom gate electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The performance of the gate electrode can be sensitive to composition and process parameters. The same holds for the diffusion barrier layer underneath the gate electrode.

Gate dielectric, 506, is formed above bottom gate electrode, 504. Examples of suitable materials for the gate dielectric include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The gate dielectric, 506, is typically formed by a deposition process followed by a patterning process. Optionally, an anneal step is implemented prior to patterning, post patterning, or both. The gate dielectric, 506, may be formed using deposition techniques such as PVD, ALD, or PECVD, or a combination thereof. The performance of the gate dielectric can be sensitive to composition and process parameters. The gate dielectric, 506, may be patterned using either wet techniques such as chemical etching, or dry techniques such as reactive ion etching (RIE). In both of these techniques, parameters such as the uniformity, etch rate, selectivity, critical dimension loss, taper angle, cost, throughput, etc. are sensitive to the process parameters of the etch process.

Metal-based semiconductor layer, 508, is formed above gate dielectric, 506. The metal-based semiconductor layer, 508, is typically formed by a deposition process followed by a patterning process. Optionally, an anneal step is implemented prior to patterning, post patterning, or both. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. In addition, the metal-based semiconductor layer may be treated prior to etch stopper or source/drain deposition with a plasma containing $O_2$ or $N_2O$. The metal-based semiconductor layer, 508, may be formed using deposition techniques such as PVD, MOCVD, or wet depositions, (e.g. based on sol-gels). The performance of the metal-based semiconductor layer can be sensitive to composition and process parameters. Examples of suitable materials for the metal-based semiconductor layer include indium gallium zinc oxide (In—Ga—Zn—O or IGZO), amorphous silicon, low-temperature polysilicon, In—Zn—O (IZO), Zn—Sn—O (ZTO), Hf—In—Zn—O (HIZO), and Al—Zn—Sn—O (AZTO), oxy-nitrides such as Zn—O—N (ZnON), In—O—N (InON), Sn—O—N(SnON), c-axis aligned crystalline (CAAC) materials such as CAAC-IGZO, or polycrystalline materials such as ZnO or In—Ga—O (IGO). Indium in these materials might be partially or completely replaced by Sn, or Sb. Gallium in these materials might be partially or completely replaced by one or more of Al, Hf, In, Nb, Si, Sn, Ta, Ti, Zn, or Zr. Oxygen in these materials might be partially or completely replaced by one or more of C, N, P, S, Se, Si, or Te. Other potential candidates as active channel (semiconductor) materials are refractory metal chalcogenides, (e.g. molybdenum sulfides). It should be noted that it is possible to deposit a bi-, or tri-layer, where each layer has a composition optimized for its functionality, the latter being contact layer with the gate insulator, bulk active channel layer, and contact layer with the source and drain electrodes and etch stopper or passivation layers. Furthermore, the active (semiconducting) channel layer might have a continuous change in composition (e.g. a gradient) through the thickness of the film. Common extrinsic (n-type) dopants for ZnO-based semiconductors are Al, B, Cr, Ga, H, In and Li. Furthermore, the metal cations in the metal-based semiconductor material (e.g. IGZO) may be partially or completely replaced by Ag, As, Au, Bi, Cd, Cu, Zn, Ga, Ge, Hg, In, Pb, Sb, Sn, and Tl. Other dopants of interest include halogens like Cl and F. In some embodiments, the In and/or Ga in the IGZO is replaced by an earth abundant element such as Al, Ba, C, Ca, Cr, Cu, Fe, K, Mg, Mn, Mo, Na, Ni, Si, Sn, Sr, Ti, V, W, Zn, or Zr (e.g. [X][Y]ZO as defined above). The metal-based semiconductor layer, 508, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process. This disclosure will use [X][Y]ZO as an example, but this is not meant to be limiting. The techniques described herein can be applied to any material suitable for display applications.

Etch stopper, 510, is formed above metal-based semiconductor layer, 508. The etch stopper, 510, is typically formed by a deposition process followed by a patterning process. Optionally, an anneal step is implemented prior to patterning, post patterning, or both. The etch stopper, 510, may be formed using deposition techniques such as PVD, ALD, PECVD, or by wet coating techniques. The performance of the etch stopper can be sensitive to composition and process parameters. Examples of suitable materials for the etch stopper include silicon oxide, silicon nitride, a stack of silicon nitride and silicon oxide, a mixture, multi-layer, or combination thereof of a high bandgap material (e.g. silicon oxide, or aluminum oxide) and high-k dielectric material (e.g. hafnium oxide, zirconium oxide, titanium oxide), a high bandgap (e.g. silicon oxide, or aluminum oxide) or high-k dielectric material (e.g. hafnium oxide, zirconium oxide, titanium oxide). In addition to these inorganic materials, various organic materials may be used as etch stopper materials as well. Examples of organic etch stopper materials include photoresist, organic polymers, UV-curable polymers, and heat-curable polymers. The etch stopper, 510, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process.

Source and drain electrodes, 512 and 514, are formed above etch stopper, 510 and exposed regions of the metal-based semiconductor layer, 108. The source and drain electrodes, 512 and 514, are typically formed by a deposition process followed by a patterning process. Optionally, an anneal step is implemented prior to patterning, post patterning, or both. The source and drain electrodes, 512 and 514, may be formed using deposition techniques such as PVD, wet deposition (e.g. plating), or MOCVD (for TCOs). Typically, the deposition steps involve sputter deposition. Patterning is commonly performed by photolithography. The photolithography most commonly relies on wet etching, yet dry etching (e.g. reactive ion etching) can be used as well. Wet etch chemistries are most commonly aqueous, and include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. The performance of the source and drain electrodes can be sensitive to composition and process parameters. The source/drain electrode is most commonly a stack of two or more layers. Examples of suitable materials for the bottom source/drain electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The source and drain electrodes, 512 and 514, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process.

Passivation layer, 516, is formed above source and drain electrodes, 512 and 514. The passivation layer, 516, is typically formed by a deposition process followed by a patterning process. Optionally, an anneal step is implemented prior to patterning, post patterning, or both. The passivation layer, 516, may be formed using deposition techniques such as PVD, ALD, or PECVD, or by wet coating techniques. The performance of the passivation layer can be sensitive to composition and process parameters. Examples of suitable materials for the passivation layer include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The passivation layer, 516, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process.

In some embodiments, between one or more of the deposition and patterning steps discussed previously (e.g. the formation of the gate electrode layer, the gate dielectric layer, the metal-based semiconductor layer, the etch stopper layer, the source/drain electrode layers, or the passivation layer), the surface of the deposited film may be subjected to a treatment process before the patterning step. Examples of treatment processes include degas steps to remove adsorbed moisture due to exposure to ambient, anneal treatments, surface cleaning treatments (either wet or dry), and plasma treatments (e.g. exposure to plasma generated species of Ar, $H_2$, $N_2$, $N_2O$, $O_2$, $O_3$, etc.).

Figure 6:
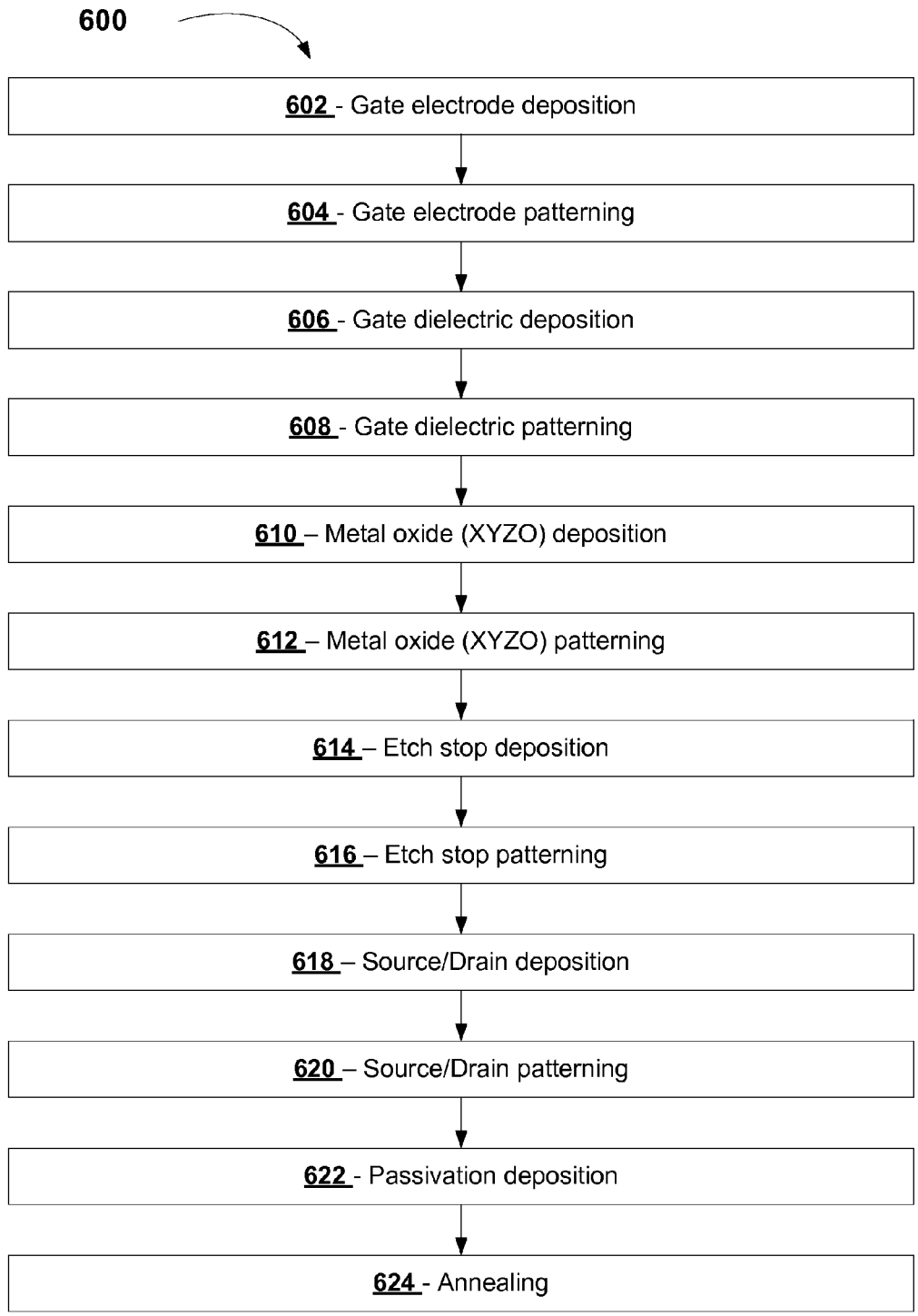
FIG. 6 is a flow chart illustrating the steps of a method according to some embodiments.

FIG. 6 is a flow chart illustrating the steps of a method according to some embodiments. In step 602, a gate electrode layer is deposited above the substrate. Typically, the gate electrode is a material with high conductivity such as a metal, metal alloy, or conductive metal compound (e.g. titanium nitride, tantalum nitride, and the like). Examples of suitable materials for the gate electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The performance of the gate electrode can be sensitive to composition and process parameters. The same holds for the diffusion barrier layer underneath the gate electrode. The gate electrode layer can be deposited using well known deposition techniques such as PVD, CVD, PECVD, PLD, evaporation, etc.

In step 604, the gate electrode layer is patterned. The gate electrode layer is patterned using known photolithography techniques followed by etching the gate electrode layer using wet and/or dry etching processes. In some embodiments, the gate electrode layer is etched using a combination of wet and dry etching processes. Examples of wet etching processes include the application of acidic, basic, or organic-solvent based solutions (depending on the material to be etched) to the gate electrode layer. Examples of dry etching processes include reactive ion etching (RIE), plasma etching, ion milling, and the like.

In step 606, a gate dielectric layer is deposited above the gate electrode layer. Typically, the gate dielectric is an insulating material such as a silicon oxide, silicon nitride, or a metal oxide such as aluminum oxide, and the like. Examples of suitable materials for the gate dielectric include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). In some embodiments, the deposition process is a vacuum-based process such as PVD, ALD, PE-ALD, AVD, UV-ALD, CVD, PECVD, PLD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In step 608, the gate dielectric layer is patterned. Optionally, an anneal step is implemented prior to patterning, post patterning, or both. The gate dielectric layer is patterned using known photolithography techniques followed by etching the gate dielectric layer using wet and/or dry etching processes. In some embodiments, the gate dielectric layer is etched using a combination of wet and dry etching processes. Examples of wet etching processes include the application of acidic, basic, or organic-solvent based solutions (depending on the material to be etched) to the gate dielectric layer. Examples of dry etching processes include reactive ion etching (RIE), plasma etching, ion milling, and the like.

In step 610, a metal-based semiconductor layer is deposited above the gate dielectric layer. Examples of suitable materials for the semiconductor layer include indium gallium zinc oxide (In—Ga—Zn—O or IGZO), amorphous silicon, low-temperature polysilicon, In—Zn—O (IZO), Zn—Sn—O (ZTO), Hf—In—Zn—O (HIZO), and Al—Zn—Sn—O (AZTO), oxy-nitrides such as Zn—O—N (ZnON), In—O—N(InON), Sn—O—N(SnON), c-axis aligned crystalline (CAAC) materials such as CAAC-IGZO, or polycrystalline materials such as ZnO or In—Ga—O (IGO). Indium in these materials might be partially or completely replaced by Sn, or Sb. Gallium in these materials might be partially or completely replaced by one or more of Al, Hf, In, Nb, Si, Sn, Ta, Ti, Zn, or Zr. Oxygen in these materials might be partially or completely replaced by one or more of C, N, P, S, Se, Si, or Te. Other potential candidates as active channel (semiconductor) materials are refractory metal chalcogenides, (e.g. molybdenum sulfides). It should be noted that it is possible to deposit a bi-, or tri-layer, where each layer has a composition optimized for its functionality, the latter being contact layer with the gate insulator, bulk active channel layer, and contact layer with the source and drain electrodes and etch stopper or passivation layers. Furthermore, the active (semiconducting) channel layer might have a continuous change in composition (e.g. a gradient) through the thickness of the film. Common extrinsic (n-type) dopants for ZnO-based semiconductors are Al, B, Cr, Ga, H, In and Li. Furthermore, the metal cations in IGZO may be partially or completely replaced by Ag, As, Au, Bi, Cd, Cu, Zn, Ga, Ge, Hg, In, Pb, Sb, Sn, and Tl. Other dopants of interest include halogens like Cl and F. In some embodiments, the In and/or Ga in the IGZO is replaced by an earth abundant element such as Al, Ba, C, Ca, Cr, Cu, Fe, K, Mg, Mn, Mo, Na, Ni, Si, Sn, Sr, Ti, V, W, Zn, or Zr (e.g. [X][Y]ZO as defined above). In some embodiments, the deposition process is a vacuum-based process such as PVD, ALD, PE-ALD, AVD, UV-ALD, CVD, PECVD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In step 612, the metal-based semiconductor layer is patterned. Optionally, an anneal step is implemented prior to patterning, post patterning, or both. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. In addition, the semiconductor layer may be treated prior to etch stopper or source/drain deposition with a plasma containing $O_2$ or $N_2O$. The metal-based semiconductor layer is patterned using known photolithography techniques followed by etching the metal-based semiconductor layer using wet and/or dry etching processes. In some embodiments, the metal-based semiconductor layer is etched using a combination of wet and dry etching processes. Examples of wet etching processes include the application of acidic, basic, or organic-solvent based solutions (depending on the material to be etched) to the metal-based semiconductor layer. Examples of dry etching processes include reactive ion etching (RIE), plasma etching, ion milling, and the like.

In step 614, an etch stop layer is deposited above the metal-based semiconductor layer. Examples of suitable materials for the etch stopper include silicon oxide, silicon nitride, a stack of silicon nitride and silicon oxide, a mixture, multi-layer, or combination thereof of a high bandgap material (e.g. silicon oxide, or aluminum oxide) and high-k dielectric material (e.g. hafnium oxide, zirconium oxide, titanium oxide), a high bandgap (e.g. silicon oxide, or aluminum oxide) or high-k dielectric material (e.g. hafnium oxide, zirconium oxide, titanium oxide). In addition to these inorganic materials, various organic materials may be used as etch stopper materials as well. Examples of organic etch stopper materials include photoresist, organic polymers, UV-curable polymers, and heat-curable polymers. In some embodiments, the deposition process is a vacuum-based process such as PVD, ALD, PE-ALD, AVD, UV-ALD, CVD, PECVD, PLD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In step 616, the etch stop layer is patterned. Optionally, an anneal step is implemented prior to patterning, post patterning, or both. The etch stop layer is patterned using known photolithography techniques followed by etching the etch stop layer using wet and/or dry etching processes. In some embodiments, the etch stop layer is etched using a combination of wet and dry etching processes. Examples of wet etching processes include the application of acidic, basic, or organic-solvent based solutions (depending on the material to be etched) to the etch stop layer. Examples of dry etching processes include reactive ion etching (RIE), plasma etching, ion milling, and the like. When dry processes are used, the upper surface of the underlying metal-based semiconductor layer may become damaged, negatively affecting the transport properties. This may require an additional step to remove a portion of the upper surface of the underlying metal-based semiconductor layer to recover the required transport properties.

In step 618, a source/drain electrode layer is deposited above the etch stop layer. The source and drain electrodes are typically deposited as a single layer and then defined during the patterning step. Typically, the source/drain electrode is a material with high conductivity such as a metal, metal alloy, or conductive metal compound (e.g. titanium nitride, tantalum nitride, and the like). Examples of suitable materials for the bottom gate electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The source/drain electrode layer can be deposited using well known deposition techniques such as PVD, CVD, PECVD, PLD, evaporation, etc.

In step 620, the source/drain electrode layer is patterned into individual source and drain electrodes. Optionally, an anneal step is implemented prior to patterning, post patterning, or both. The source/drain electrode layer is patterned using known photolithography techniques followed by etching the source/drain electrode layer using wet and/or dry etching processes. In some embodiments, the source/drain electrode layer is etched using a combination of wet and dry etching processes. Examples of wet etching processes include the application of acidic, basic, or organic-solvent based solutions (depending on the material to be etched) to the source/drain electrode layer. Wet etch chemistries are most commonly aqueous, and include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. Examples of dry etching processes include reactive ion etching (RIE), plasma etching, ion milling, and the like. The performance of the source and drain electrodes can be sensitive to composition and process parameters.

In step 622, a passivation layer is deposited and patterned above the source/drain layer to form a TFT stack. Typically, the passivation layer is an insulating material such as a silicon oxide, silicon nitride, or a metal oxide such as aluminum oxide, and the like. Examples of suitable materials for the passivation layer include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The passivation layer can be deposited using well known deposition techniques such as PVD, CVD, PECVD, PLD, evaporation, etc.

In step 624, the TFT stack is annealed. The annealing serves to passivate defects that may have been formed during any of the deposition and/or etching steps and also serves to reduce the number of oxygen vacancies that may have been formed in the metal-based semiconductor material. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. The annealing is typically performed in a temperature range between 150 C. and 400 C. for times between 10 minutes and 60 minutes.

In some embodiments, between one or more of the deposition and patterning steps discussed previously (e.g. the formation of the gate electrode layer, the gate dielectric layer, the metal-based semiconductor layer, the etch stopper layer, the source/drain electrode layers, or the passivation layer), the surface of the deposited film may be subjected to a treatment process before the patterning step. Examples of treatment processes include degas steps to remove adsorbed moisture due to exposure to ambient, anneal treatments, surface cleaning treatments (either wet or dry), and plasma treatments (e.g. exposure to plasma generated species of Ar, $H_2$, $N_2$, $N_2O$, $O_2$, $O_3$, etc.).

The performance of the metal-based semiconductor layer will be sensitive to parameters such as composition, crystal structure, oxygen vacancies, surface defects, interface state density, and the like. Many of these parameters will be influenced by the processing of the material and the process conditions to which the material is exposed. As an example, in the method as outlined in FIG. 6, the metal-based semiconductor material is exposed to air (after deposition), photoresist and photoresist developer (during patterning), etch chemistries (either wet, dry, or both), processing conditions related to the deposition of the etch stop layer (e.g. elevated temperatures, plasma bombardment, etc.), processing conditions related to the patterning of the etch stop layer (either wet, dry, or both), and processing conditions related to the deposition of the source/drain layer (e.g. elevated temperatures, plasma bombardment, etc.). Those skilled in the art will understand that the active channel of the metal-based semiconductor layer is protected by the etch stop layer, but that regions of the metal-based semiconductor layer outside the active channel will be exposed to the processing conditions related to the deposition of the source/drain layer.

In some embodiments, the metal-based semiconductor layer is based on an IGZO-like material (e.g. [X][Y]GO) wherein the In and/or Ga in the IGZO is replaced by an earth abundant element such as Al, Ba, C, Ca, Cr, Cu, Fe, K, Mg, Mn, Mo, Na, Ni, Si, Sn, Sr, Ti, V, W, Zn, or Zr. Some of these materials exhibit stable amorphous phases, high mobility (e.g. >5 $cm^2$/Vs), low threshold voltage (close to zero, e.g. in a range of −1.0V to +2.0V), low carrier concentrations (e.g. $10^{16}$-$10^{17}$ $cm^{-3}$), high ON/OFF current ratios (e.g. >$10^6$), and high durability (e.g. negative bias temperature illumination stress NBTIS with threshold voltage shift in a range of −1.5V to +0.5V). However, since these materials are multinary compounds (e.g. three or more elements), their performance and properties are sensitive to factors such as composition, concentration gradients, deposition parameters, post-deposition treatments, interactions with adjacent materials, and the like.

FIG. 7 is a table illustrating some of the manufacturing steps that can be investigated using HPC techniques. The gate electrode deposition and patterning steps have been well established. Therefore, they can be formed using convention, full substrate processing techniques. The steps from "gate dielectric deposition" through the "source/drain patterning"

can each be completed using either conventional, full substrate processing or HPC processing as discussed previously. As indicated in the table, there are at least eight steps in the manufacture of a TFT that would benefit from development and optimization through the application of HPC techniques. As discussed with respect to FIG. 2, each step in the manufacturing process can be completed using either conventional or HPC processing techniques. Those skilled in the art will understand that this represents a potential of at least 4096 possible trajectories through the TFT manufacturing process using combinations of conventional and HPC processing techniques.

In some embodiments, HPC techniques are applied to the development and optimization of the metal-based semiconductor layer used in the manufacture of TFTs used in display devices. In some embodiments, the semiconductor layer is based on an IGZO-like material (e.g. [X][Y]ZO as defined above) wherein the In and/or Ga in the IGZO is replaced by an earth abundant element such as Al, Ba, C, Ca, Cr, Cu, Fe, K, Mg, Mn, Mo, Na, Ni, Si, Sn, Sr, Ti, V, W, Zn, or Zr. Some of the requirements for the semiconductor layer used in these TFTs include remaining amorphous throughout the processing of the TFT, a high field effect mobility (e.g. $U_{FE}$>5 cm$^2$/Vs), a low threshold voltage, a low carrier concentration, a high On/Off current ratio, a small sub-threshold swing, and durability, and the like. [X][Y]ZO is a multinary compound and presents several challenges. The performance of [X][Y]ZO-based semiconductor layers is sensitive to factors such as composition, composition uniformity (e.g. gradients and/or multiple phases), interfacial reactions with neighboring layers, process parameters, defect concentrations and distribution, thermal treatments, and the like.

It is convenient to present the concentration of each of the metallic components of the material as a ratio against the total metallic concentration (e.g. X=(X/(X+Y+Zn)); Y=(Y/(X+Y+Zn)); Zn=(Zn/(X+Y+Zn))). Conventional processing systems employ PVD chambers with a single target including a specific composition of [X][Y]ZO (e.g. a fully oxidized target with a defined metallic composition). The deposition of the [X][Y]ZO semiconductor layer is usually accomplished using reactive sputtering wherein oxygen is introduced to the sputtering gas to ensure that the deposited film is fully oxidized. The composition of the deposited film can be varied over a very small range by varying process parameters such as power and pressure. Due to small differences in the sputtering yield of the various components of the target, small differences in the composition of the deposited layer can be realized. Therefore, a thorough investigation of the complete composition range of the [X][Y]ZO material would require many targets with varying compositions to be used in a conventional processing system. This increases the cost and increases the time to fully characterize the [X][Y]ZO material.

In some embodiments, the composition of the [X][Y]ZO semiconductor layer can be varied using an HPC PVD system such as discussed with respect to FIG. 4. Many types of targets can be used in an HPC PVD chamber to investigate a wide range of compositions for the [X][Y]ZO semiconductor layer. Some examples include [X][Y]ZO targets of varying compositions, binary metal oxide targets of the various components, metallic targets, or any combination thereof. The power applied to each target can be controlled independently, leading to a wide range of potential compositions. Further, as discussed previously, multiple SIRs formed on a single substrate (for example, through a shadow mask or by scribing) allow the investigation of many compositions in a single deposition step. This reduces the cost and shortens the time to fully characterize the [X][Y]ZO material.

In some embodiments, other elements are added to or substituted for all or some of the components of the [X][Y]ZO material. As an example, tin can be substituted for some or all of the indium. As an example, one or more of aluminum, zirconium, hafnium, or silicon can be substituted for some or all of the gallium. As an example, one or more of nitrogen, sulfur, selenium, or tellurium can be substituted for some or all of the oxygen. Applying the HPC techniques discussed previously would greatly increase the efficiency of the investigation of this expanded material system.

FIG. 8 is a table illustrating some of the processing variables that can be investigated using HPC techniques. The concentration of each of the primary metal components of the [X][Y]ZO can be evaluated over at least three levels. As discussed previously, there are at least nine elements that can be used as substitutes for at least one of the components of the [X][Y]ZO. The composition of each of these nine elements can be evaluated over at least three levels. Deposition parameters such as power, pressure, and gas composition can be evaluated over at least three levels. Annealing parameters such as temperature, time, and ambient can be evaluated over at least three levels. The composition gradient of each of the primary metal components through the thickness of the [X][Y]ZO layer can be evaluated over at least three levels. Those skilled in the art will understand that this simple list of processing variables and levels represents a full factorial experimental design that approaches five million experiments. Further, similar lists can be created for each of the eight steps that were identified as being potential candidates for HPC evaluation in FIG. 7.

FIG. 9 is a simplified cross-sectional view of a TFT according to some embodiments. Gate electrode, 904, is formed above substrate, 902. As discussed previously, the substrate may be any commonly used substrate for display devices such as one of float glass, low-iron glass, borosilicate glass, display glass, alkaline earth boro-aluminosilicate glass, fusion drawn glass, flexible glass, specialty glass for high temperature processing, polyimide, plastics, PET, etc. for either applications requiring transparent or non-transparent substrate functionality. For substrates with no need for transparency, substrates like aluminum foil, stainless steel, carbon steel, paper, cladded foils, etc. can be utilized. The substrate optionally is covered by a diffusion barrier, (e.g. silicon oxide, silicon nitride, or silicon oxy-nitride). The bottom gate electrode, 904, is typically formed by a deposition process followed by a patterning process. Optionally, an anneal step is implemented prior to patterning, post patterning, or both. A typical deposition method involves sputter deposition. Patterning is typically performed by photolithography. The photolithography most commonly relies on wet etching, yet dry etching (e.g. reactive ion etching) can be used as well. Wet etch chemistries are most commonly aqueous, and include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. The gate electrode is most commonly a stack of two or more layers. Examples of suitable materials for the bottom gate electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The performance of the gate electrode can be sensitive to composition and process parameters. The same holds for the diffusion barrier layer underneath the gate electrode.

Gate dielectric, 906, is formed above bottom gate electrode, 904. Examples of suitable materials for the gate dielectric include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The gate dielectric, 906, is typically formed by a deposition process followed by a patterning process. Optionally, an anneal step is implemented prior to patterning, post patterning, or both. The gate dielectric, 906, may be formed using deposition techniques such as PVD, ALD, or PECVD, or a combination thereof. The performance of the gate dielectric can be sensitive to composition and process parameters. The gate dielectric, 906, may be patterned using either wet techniques such as chemical etching, or dry techniques such as reactive ion etching (RIE). In both of these techniques, parameters such as the uniformity, etch rate, selectivity, critical dimension loss, taper angle, cost, throughput, etc. are sensitive to the process parameters of the etch process.

Metal-based semiconductor layer, 908, is formed above gate dielectric, 906. The metal-based semiconductor layer, 908, is typically formed by a deposition process followed by a patterning process. Optionally, an anneal step is implemented prior to patterning, post patterning, or both. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. In addition, the metal-based semiconductor layer may be treated prior to etch stopper or source/drain deposition with a plasma containing $O_2$ or $N_2O$. The metal-based semiconductor layer, 908, may be formed using deposition techniques such as PVD, MOCVD, or wet depositions, (e.g. based on sol-gels). The performance of the metal-based semiconductor layer can be sensitive to composition and process parameters. Examples of suitable materials for the metal-based semiconductor layer include indium gallium zinc oxide (In—Ga—Zn—O or IGZO), amorphous silicon, low-temperature polysilicon, In—Zn—O (IZO), Zn—Sn—O (ZTO), Hf—In—Zn—O (HIZO), and Al—Zn—Sn—O (AZTO), oxy-nitrides such as Zn—O—N (ZnON), In—O—N (InON), Sn—O—N(SnON), c-axis aligned crystalline (CAAC) materials such as CAAC-IGZO, or polycrystalline materials such as ZnO or In—Ga—O (IGO). Indium in these materials might be partially or completely replaced by Sn, or Sb. Gallium in these materials might be partially or completely replaced by one or more of Al, Hf, In, Nb, Si, Sn, Ta, Ti, Zn, or Zr. Oxygen in these materials might be partially or completely replaced by one or more of C, N, P, S, Se, Si, or Te. Other potential candidates as active channel (semiconductor) materials are refractory metal chalcogenides, (e.g. molybdenum sulfides). It should be noted that it is possible to deposit a bi-, or tri-layer, where each layer has a composition optimized for its functionality, the latter being contact layer with the gate insulator, bulk active channel layer, and contact layer with the source and drain electrodes and etch stopper or passivation layers. Furthermore, the active (semiconducting) channel layer might have a continuous change in composition (e.g. a gradient) through the thickness of the film. Common extrinsic (n-type) dopants for ZnO-based semiconductors are Al, B, Cr, Ga, H, In and Li. Furthermore, the metal cations in the metal-based semiconductor material (e.g. IGZO) may be partially or completely replaced by Ag, As, Au, Bi, Cd, Cu, Zn, Ga, Ge, Hg, In, Pb, Sb, Sn, and Tl. In some embodiments, the metal-based semiconductor layer is based on an IGZO-like material (e.g. [X][Y]ZO as defined above) wherein the In and/or Ga in the IGZO is replaced by an earth abundant element such as Al, Ba, C, Ca, Cr, Cu, Fe, K, Mg, Mn, Mo, Na, Ni, Si, Sn, Sr, Ti, V, W, Zn, or Zr. The metal-based semiconductor layer, 908, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process. This disclosure will use [X][Y]ZO as an example, but this is not meant to be limiting. The techniques described herein can be applied to any material suitable for display applications.

Source and drain electrodes, 912 and 914, are formed above the metal-based semiconductor layer, 908. The source and drain electrodes, 912 and 914, are typically formed by a deposition process followed by a patterning process. Optionally, an anneal step is implemented prior to patterning, post patterning, or both. The source and drain electrodes, 912 and 914, may be formed using deposition techniques such as PVD, wet deposition (e.g. plating), or MOCVD (for TCOs). Typically, the deposition steps involve sputter deposition. Patterning is commonly performed by photolithography. The photolithography most commonly relies on wet etching, yet dry etching (e.g. reactive ion etching) can be used as well. Wet etch chemistries are most commonly aqueous, and include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. The performance of the source and drain electrodes can be sensitive to composition and process parameters. The gate electrode is most commonly a stack of two or more layers. Examples of suitable materials for the bottom gate electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The source and drain electrodes, 912 and 914, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process.

Passivation layer, 916, is formed above source and drain electrodes, 912 and 914. The passivation layer, 916, is typically formed by a deposition process followed by a patterning process. Optionally, an anneal step is implemented prior to patterning, post patterning, or both. The passivation layer, 916, may be formed using deposition techniques such as PVD, ALD, or PECVD, or by wet coating techniques. The performance of the passivation layer can be sensitive to composition and process parameters. Examples of suitable materials for the passivation layer include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The passivation layer, 916, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process.

In some embodiments, between one or more of the deposition and patterning steps discussed previously (e.g. the formation of the gate electrode layer, the gate dielectric layer, the metal-based semiconductor layer, the source/drain electrode layers, or the passivation layer), the surface of the deposited film may be subjected to a treatment process before the patterning step. Examples of treatment processes include degas steps to remove adsorbed moisture due to exposure to ambient, anneal treatments, surface cleaning treatments (either wet or dry), and plasma treatments (e.g. exposure to plasma generated species of Ar, $H_2$, $N_2$, $N_2O$, $O_2$, $O_3$, etc.).

Figure 10:
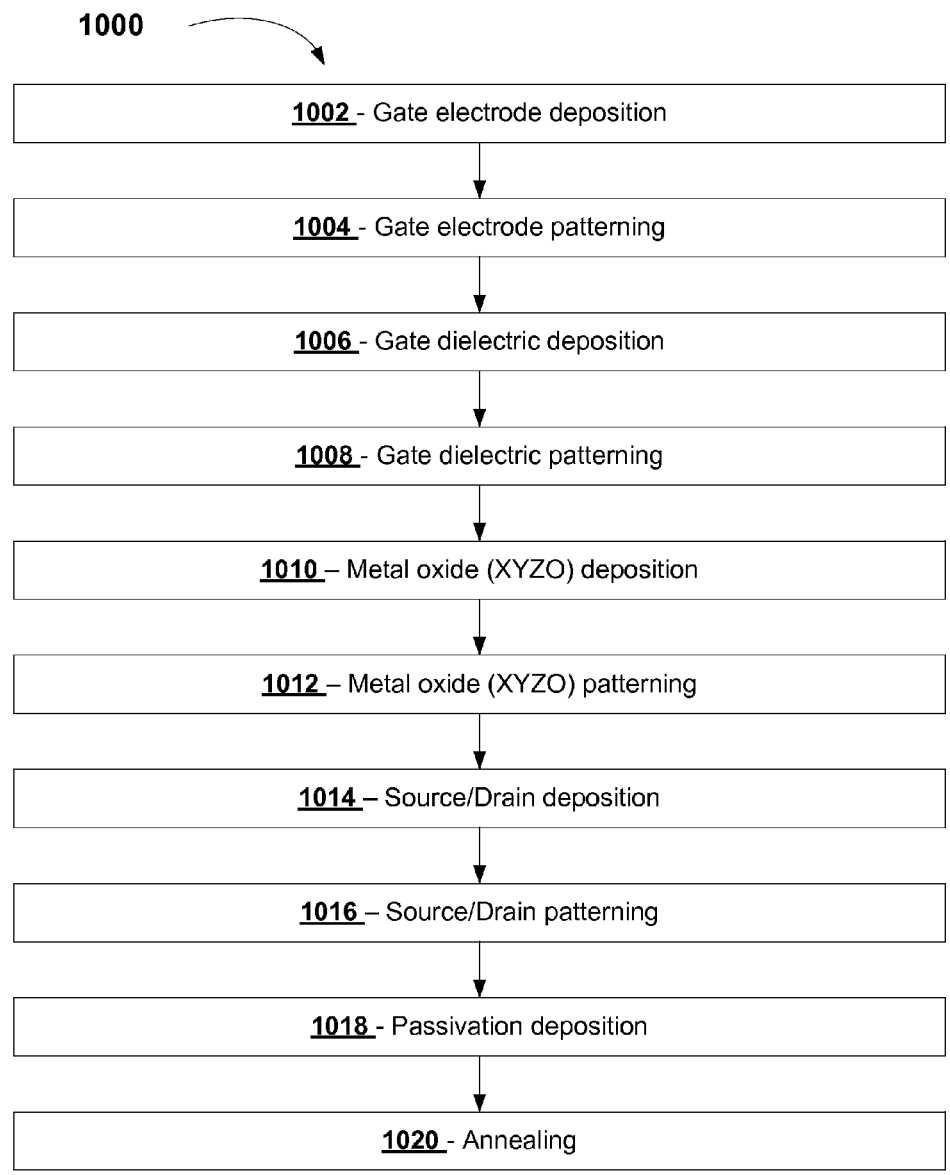
FIG. 10 is a flow chart illustrating the steps of a method according to some embodiments.

FIG. 10 is a flow chart illustrating the steps of a method according to some embodiments. In step 1002, a gate electrode layer is deposited above the substrate. Typically, the gate electrode is a material with high conductivity such as a metal, metal alloy, or conductive metal compound (e.g. titanium nitride, tantalum nitride, and the like). Examples of suitable materials for the gate electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The performance of the gate electrode can be sensitive to composition and process parameters. The same holds for the diffusion barrier layer underneath the gate electrode. The gate electrode layer can be deposited using well known deposition techniques such as PVD, CVD, PECVD, PLD, evaporation, etc.

In step 1004, the gate electrode layer is patterned. The gate electrode layer is patterned using known photolithography techniques followed by etching the gate electrode layer using wet and/or dry etching processes. In some embodiments, the gate electrode layer is etched using a combination of wet and dry etching processes. Examples of wet etching processes include the application of acidic, basic, or organic-solvent based solutions (depending on the material to be etched) to the gate electrode layer. Examples of dry etching processes include reactive ion etching (RIE), plasma etching, ion milling, and the like.

In step 1006, a gate dielectric layer is deposited above the gate electrode layer. Typically, the gate dielectric is an insulating material such as a silicon oxide, silicon nitride, or a metal oxide such as aluminum oxide, and the like. Examples of suitable materials for the gate dielectric include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). In some embodiments, the deposition process is a vacuum-based process such as PVD, ALD, PE-ALD, AVD, UV-ALD, CVD, PECVD, PLD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In step 1008, the gate dielectric layer is patterned. Optionally, an anneal step is implemented prior to patterning, post patterning, or both. The gate dielectric layer is patterned using known photolithography techniques followed by etching the gate dielectric layer using wet and/or dry etching processes. In some embodiments, the gate dielectric layer is etched using a combination of wet and dry etching processes. Examples of wet etching processes include the application of acidic, basic, or organic-solvent based solutions (depending on the material to be etched) to the gate dielectric layer. Examples of dry etching processes include reactive ion etching (RIE), plasma etching, ion milling, and the like.

In step 1010, a metal-based semiconductor layer is deposited above the gate dielectric layer. Examples of suitable materials for the semiconductor layer include indium gallium zinc oxide (In—Ga—Zn—O or IGZO), amorphous silicon, low-temperature polysilicon, In—Zn—O (IZO), Zn—Sn—O (ZTO), Hf—In—Zn—O (HIZO), and Al—Zn—Sn—O (AZTO), oxy-nitrides such as Zn—O—N (ZnON), In—O—N(InON), Sn—O—N(SnON), c-axis aligned crystalline (CAAC) materials such as CAAC-IGZO, or polycrystalline materials such as ZnO or In—Ga—O (IGO). Indium in these materials might be partially or completely replaced by Sn, or Sb. Gallium in these materials might be partially or completely replaced by one or more of Al, Hf, In, Nb, Si, Sn, Ta, Ti, Zn, or Zr. Oxygen in these materials might be partially or completely replaced by one or more of C, N, P, S, Se, Si, or Te. Other potential candidates as active channel (semiconductor) materials are refractory metal chalcogenides, (e.g. molybdenum sulfides). It should be noted that it is possible to deposit a bi-, or tri-layer, where each layer has a composition optimized for its functionality, the latter being contact layer with the gate insulator, bulk active channel layer, and contact layer with the source and drain electrodes and etch stopper or passivation layers. Furthermore, the active (semiconducting) channel layer might have a continuous change in composition (e.g. a gradient) through the thickness of the film. Common extrinsic (n-type)

dopants for ZnO-based semiconductors are Al, B, Cr, Ga, H, In and Li. Furthermore, the metal cations in IGZO may be partially or completely replaced by Ag, As, Au, Bi, Cd, Cu, Zn, Ga, Ge, Hg, In, Pb, Sb, Sn, and Tl. Other dopants of interest include halogens like Cl and F. In some embodiments, the In and/or Ga in the IGZO is replaced by an earth abundant element such as Al, Ba, C, Ca, Cr, Cu, Fe, K, Mg, Mn, Mo, Na, Ni, Si, Sn, Sr, Ti, V, W, Zn, or Zr (e.g. [X][Y]ZO as defined above). In some embodiments, the deposition process is a vacuum-based process such as PVD, ALD, PE-ALD, AVD, UV-ALD, CVD, PECVD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In step 1012, the metal-based semiconductor layer is patterned. Optionally, an anneal step is implemented prior to patterning, post patterning, or both. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. In addition, the semiconductor layer may be treated prior to etch stopper or source/drain deposition with a plasma containing $O_2$ or $N_2O$. The metal-based semiconductor layer is patterned using known photolithography techniques followed by etching the metal-based semiconductor layer using wet and/or dry etching processes. In some embodiments, the metal-based semiconductor layer is etched using a combination of wet and dry etching processes. Examples of wet etching processes include the application of acidic, basic, or organic-solvent based solutions (depending on the material to be etched) to the metal-based semiconductor layer. Examples of dry etching processes include reactive ion etching (RIE), plasma etching, ion milling, and the like.

In step 1014, a source/drain electrode layer is deposited above the metal-based semiconductor layer. The source and drain electrodes are typically deposited as a single layer and then defined during the patterning step. Typically, the source/drain electrode is a material with high conductivity such as a metal, metal alloy, or conductive metal compound (e.g. titanium nitride, tantalum nitride, and the like). Examples of suitable materials for the source/drain electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The source/drain electrode layer can be deposited using well known deposition techniques such as PVD, CVD, PECVD, PLD, evaporation, etc.

In step 1016, the source/drain electrode layer is patterned into individual source and drain electrodes. Optionally, an anneal step is implemented prior to patterning, post patterning, or both. The source/drain electrode layer is patterned using known photolithography techniques followed by etching the source/drain electrode layer using wet and/or dry etching processes. In some embodiments, the source/drain electrode layer is etched using a combination of wet and dry etching processes. Examples of wet etching processes include the application of acidic, basic, or organic-solvent based solutions (depending on the material to be etched) to the source/drain electrode layer. Wet etch chemistries are most commonly aqueous, and include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. Examples of dry etching processes include reactive ion etching (RIE), plasma etching, ion milling, and the like. The performance of the source and drain electrodes can be sensitive to composition and process parameters.

Optionally, a thin layer of the active channel of the metal-based semiconductor layer is removed after the patterning of the source/drain layer to remove damage introduced during processing.

In step 1018, a passivation layer is deposited and patterned above the source/drain layer to form a TFT stack. Typically, the passivation layer is an insulating material such as a silicon oxide, silicon nitride, or a metal oxide such as aluminum oxide, and the like. Examples of suitable materials for the passivation layer include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The passivation layer can be deposited using well known deposition techniques such as PVD, CVD, PECVD, PLD, evaporation, etc.

In step 1020, the TFT stack is annealed. The annealing serves to passivate defects that may have been formed during any of the deposition and/or etching steps and also serves to reduce the number of oxygen vacancies that may have been formed in the metal-based semiconductor material. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. The annealing is typically performed in a temperature range between 150 C and 400 C for times between 10 minutes and 60 minutes.

In some embodiments, between one or more of the deposition and patterning steps discussed previously (e.g. the formation of the gate electrode layer, the gate dielectric layer, the metal-based semiconductor layer, the etch stopper layer, the source/drain electrode layers, or the passivation layer), the surface of the deposited film may be subjected to a treatment process before the patterning step. Examples of treatment processes include degas steps to remove adsorbed moisture due to exposure to ambient, anneal treatments, surface cleaning treatments (either wet or dry), and plasma treatments (e.g. exposure to plasma generated species of Ar, $H_2$, $N_2$, $N_2O$, $O_2$, $O_3$, etc.).

The performance of the metal-based semiconductor layer will be sensitive to parameters such as composition, crystal structure, oxygen vacancies, surface defects, interface state density, and the like. Many of these parameters will be influenced by the processing of the material and the process conditions to which the material is exposed. As an example, in the method as outlined in FIG. 10, the metal-based semiconductor material is exposed to air (after deposition), photoresist and photoresist developer (during patterning), etch chemistries (either wet, dry, or both), processing conditions related to the deposition of the source/drain layer (e.g. elevated temperatures, plasma bombardment, etc.), and processing conditions related to the patterning of the source/drain layer (either wet, dry, or both). Those skilled in the art will understand that the active channel of the metal-based semiconductor layer is exposed to all of these processing conditions. As discussed previously, typically, a thin layer of the active channel of the metal-based semiconductor layer is removed after the patterning of the source/drain layer to remove damage introduced during processing.

In some embodiments, the metal-based semiconductor layer is based on an IGZO-like material (e.g. [X][Y]ZO) wherein the In and/or Ga in the IGZO is replaced by an earth abundant element such as Al, Ba, C, Ca, Cr, Cu, Fe, K, Mg, Mn, Mo, Na, Ni, Si, Sn, Sr, Ti, V, W, Zn, or Zr. Some of these materials exhibit stable amorphous phases, high mobility (e.g. >5 cm$^2$/Vs), low threshold voltage (close to zero, e.g. in a range of −1.0V to +2.0V), low carrier concentrations (e.g. $10^{16}$-$10^{17}$ cm$^{-3}$), high ON/OFF current ratios (e.g. >$10^6$), and high durability (e.g. negative bias temperature illumination stress NBTIS with threshold voltage shift in a range of −1.5V to +0.5V). However, since these materials are multinary compounds (e.g. three or more elements), their performance and properties are sensitive to factors such as composition, concentration gradients, deposition parameters, post-deposition treatments, interactions with adjacent materials, and the like.

FIG. 11 is a table illustrating some of the manufacturing steps that can be investigated using HPC techniques. The gate electrode deposition and patterning steps have been well established. Therefore, they can be formed using convention, full substrate processing techniques. The steps from "gate dielectric deposition" through the "source/drain patterning" can each be completed using either conventional, full substrate processing or HPC processing as discussed previously. As indicated in the table, there are at least eight steps in the manufacture of a TFT that would benefit from development and optimization through the application of HPC techniques. As discussed with respect to FIG. 2, each step in the manufacturing process can be completed using either conventional or HPC processing techniques. Those skilled in the art will understand that this represents a potential of at least 1024 possible trajectories through the TFT manufacturing process using combinations of conventional and HPC processing techniques.

In some embodiments, HPC techniques are applied to the development and optimization of the semiconductor layer used in the manufacture of TFTs used in display devices. In some embodiments, the semiconductor layer is based on an [X][Y]ZO material. Some of the requirements for the semiconductor layer used in these TFTs include remaining amorphous throughout the processing of the TFT, a high field effect mobility (e.g. $U_{FE}$>5 cm$^2$/Vs), a low threshold voltage, a low carrier concentration, a high On/Off current ratio, a small sub-threshold swing, durability, and the like. [X][Y]ZO is a multinary compound and presents several challenges. The performance of IGZO-based semiconductor layers is sensitive to factors such as composition, composition uniformity (e.g. gradients and/or multiple phases), interfacial reactions with neighboring layers, process parameters, defect concentrations and distribution, thermal treatments, and the like.

It is convenient to present the concentration of each of the metallic components of the material as a ratio against the total metallic concentration (e.g. X=(X/(X+Y+Zn)); Y=(Y/(X+Y+Zn)); Zn=(Zn/(X+Y+Zn))). Conventional processing systems employ PVD chambers with a single target including a specific composition of [X][Y]ZO (e.g. a fully oxidized target with a defined metallic composition). The deposition of the [X][Y]ZO semiconductor layer is usually accomplished using reactive sputtering wherein oxygen is introduced to the sputtering gas to ensure that the deposited film is fully oxidized. The composition of the deposited film can be varied over a very small range by varying process parameters such as power and pressure. Due to small differences in the sputtering yield of the various components of the target, small differences in the composition of the deposited layer can be realized. Therefore, a thorough investigation of the complete composition range of the [X][Y]ZO material would require many targets with varying compositions to be used in a conventional processing system. This increases the cost and increases the time to fully characterize the [X][Y]ZO material.

In some embodiments, the composition of the [X][Y]ZO semiconductor layer can be varied using an HPC PVD system such as discussed with respect to FIG. 4. Many types of targets can be used in an HPC PVD chamber to investigate a wide range of compositions for the [X][Y]ZO semiconductor layer. Some examples include [X][Y]ZO targets of varying compositions, binary metal oxide targets of the various components, metallic targets, or any combination thereof. The power applied to each target can be controlled independently, leading to a wide range of potential compositions. Further, as discussed previously, multiple SIRs formed on a single substrate (either through a shadow mask or by scribing a film with a controlled lateral gradient) allow the investigation of many compositions in a single deposition step. This reduces the cost and shortens the time to fully characterize the [X][Y]ZO material.

In some embodiments, other elements are added to or substituted for all or some of the components of the [X][Y]ZO material. As an example, tin can be substituted for some or all of the indium. As an example, one or more of aluminum, zirconium, hafnium, or silicon can be substituted for some or all of the gallium. As an example, one or more of nitrogen, sulfur, selenium, or tellurium can be substituted for some or all of the oxygen. Applying the HPC techniques discussed previously would greatly increase the efficiency of the investigation of this expanded material system.

FIG. 12 is a table illustrating some of the processing variables that can be investigated using HPC techniques. The concentration of each of the primary metal components of the [X][Y]ZO can be evaluated over at least three levels. As discussed previously, there are at least nine elements that can be used as substitutes for at least one of the components of the [X][Y]ZO. The composition of each of these nine elements can be evaluated over at least three levels. Deposition parameters such as power, pressure, and gas composition can be evaluated over at least three levels. Annealing parameters such as temperature, time, and ambient can be evaluated over at least three levels. The composition gradient of each of the primary metal components through the thickness of the [X][Y]ZO layer can be evaluated over at least three levels. Those skilled in the art will understand that this simple list of processing variables and levels represents a full factorial experimental design that approaches five million experiments. Further, similar lists can be created for each of the eight steps that were identified as being potential candidates for HPC evaluation in FIG. 11.

FIG. 13 is a flow chart illustrating the steps of a method according to some embodiments. FIG. 13 presents a method, 1300, including at least three steps. Those skilled in the art will understand that there may be additional steps that are not listed for brevity. Those skilled in the art will also understand that each of the steps may actually include several operations.

In step 1302, at least a first site-isolated region (SIR) on a substrate is processed using a first set of process parameters. Some examples of the process include the candidates listed in the tables in FIGS. 7 and 11 and discussed previously (e.g. gate dielectric deposition, gate dielectric patterning, metal-based semiconductor (e.g. [X][Y]ZO) deposition, metal-based semiconductor (e.g. [X][Y]ZO) patterning, etch stop deposition, etch stop patterning, source/drain deposition, and source/drain patterning).

In step 1304, at least a second SIR on the substrate is processed using a second set of process parameters. As in step 1302, some examples of the process include the eight candidates listed in the tables in FIGS. 7 and 11 and discussed previously (e.g. gate dielectric deposition, gate dielectric patterning, metal-based semiconductor (e.g. [X][Y]ZO) deposition, metal-based semiconductor (e.g. [X][Y]ZO) patterning, etch stop deposition, etch stop patterning, source/drain deposition, and source/drain patterning). Those skilled in the art will also understand that the concepts illustrated in steps 1302 and 1304 can be extended to any number of SIRs that might be present on the substrate.

After all of the SIRs present on the substrate have been processed, the results of the processing (e.g. the performance of the TFT) are evaluated for each of the SIRs in step 1306. Examples of the types of evaluations include layer thickness, thickness uniformity, carrier mobility, composition, crystal structure, sheet resistance, optical properties, stress, and the like. If the materials processed within the SIRs are further processed to form simple devices, then additional types of device-based evaluations such as current-voltage behavior, capacitance-voltage behavior, determination of threshold voltage, determination of ON/OFF current ratios, transconductance, and the like, can be applied to the simple devices.

In some embodiments, the first process, 1302, and the second process, 1304, (and additional processes as discussed previously) include the deposition of a gate dielectric material that could be used in a TFT device. In some embodiments, the deposition process is a vacuum-based process such as PVD, ALD, PE-ALD, AVD, UV-ALD, CVD, PECVD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In some embodiments, the first process, 1302, and the second process, 1304, (and additional processes as discussed previously) include the patterning of a gate dielectric material that could be used in a TFT device. In some embodiments, the patterning process is a vacuum-based process such as plasma etching, reactive ion etching, ion milling, and the like. In some embodiments, the patterning process is a solution-based process such as chemical etching. Furthermore, the substrates may be processed in many configurations such as single substrate processing, multiple substrate batch processing, in-line continuous processing, in-line "stop and soak" processing, or roll-to-roll processing.

In some embodiments, the first process, 1302, and the second process, 1304, (and additional processes as discussed previously) include the deposition of a metal-based semiconductor material that could be used in a TFT device. In some embodiments, the deposition process is a vacuum-based process such as PVD, ALD, PE-ALD, AVD, UV-ALD, CVD, PECVD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing. In some embodiments, the metal-based semiconductor material includes In—Ga—Zn—O. In some embodiments, the metal-based semiconductor material includes at least one of Sn, Al, Zr, Hf, Si, N, S, Se, or Te.

In some embodiments, the first process, 1302, and the second process, 1304, (and additional processes as discussed previously) include the patterning of a metal-based semiconductor material that could be used in a TFT device. In some embodiments, the patterning process is a vacuum-based process such as plasma etching, reactive ion etching, ion milling, and the like. In some embodiments, the patterning process is a solution-based process such as chemical etching. Furthermore, the substrates may be processed in many configurations such as single substrate processing, multiple substrate batch processing, in-line continuous processing, in-line "stop and soak" processing, or roll-to-roll processing.

In some embodiments, the first process, 1302, and the second process, 1304, (and additional processes as discussed previously) include the deposition of an etch stop material that could be used in a TFT device. In some embodiments, the deposition process is a vacuum-based process such as PVD, ALD, PE-ALD, AVD, UV-ALD, CVD, PECVD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In some embodiments, the first process, 1302, and the second process, 1304, (and additional processes as discussed previously) include the patterning of an etch stop material that could be used in a TFT device. In some embodiments, the patterning process is a vacuum-based process such as plasma etching, reactive ion etching, ion milling, and the like. In some embodiments, the patterning process is a solution-based process such as chemical etching. Furthermore, the substrates may be processed in many configurations such as single substrate processing, multiple substrate batch processing, in-line continuous processing, in-line "stop and soak" processing, or roll-to-roll processing.

In some embodiments, the first process, 1302, and the second process, 1304, (and additional processes as discussed previously) include the deposition of a source/drain material that could be used in a TFT device. In some embodiments, the deposition process is a vacuum-based process such as PVD, ALD, PE-ALD, AVD, UV-ALD, CVD, PECVD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In some embodiments, the first process, 1302, and the second process, 1304, (and additional processes as discussed previously) include the patterning of a source/drain material that could be used in a TFT device. In some embodiments, the patterning process is a vacuum-based process such as plasma etching, reactive ion etching, ion milling, and the like. In some embodiments, the patterning process is a solution-based process such as chemical etching. Furthermore, the substrates may be processed in many configurations such as single substrate processing, multiple substrate batch processing, in-line continuous processing, in-line "stop and soak" processing, or roll-to-roll processing.

FIG. 14 is a flow chart illustrating the steps of a method according to some embodiments. FIG. 14 presents a method, 1400, including at least three steps. Those skilled in the art will understand that there may be additional steps that are not listed for brevity. Those skilled in the art will also understand that each of the steps may actually include several operations.

In some embodiments, step, 1402, (and additional processes as discussed previously) includes the deposition of a material that could be used in a TFT device. Some examples of the process include the deposition candidates listed in the tables in FIGS. 7 and 11 and discussed previously (e.g. gate electrode deposition, gate dielectric deposition, metal-based semiconductor (e.g. [X][Y]ZO) deposition, etch stop deposition, and source/drain deposition). The deposition process (either vacuum-based or solution-based) is performed such that a gradient in at least one of the material properties of the material is formed in at least one direction (e.g. length or width) across the substrate. In some embodiments, the gradient is formed in both directions (e.g. length and width) across the substrate. Examples of material properties that can be varied across the substrate include composition, thickness, resistivity, optical properties, crystal orientation, and the like.

In step 1404, site-isolated regions (SIR) are defined on the substrate by removing the material between the SIRs. Examples of methods that can be used to define the SIRs include scribing and lithography.

After all of the SIRs present on the substrate have been defined, the results of the processing are evaluated for each of the SIRs in step 1406. Examples of the types of evaluations include layer thickness, thickness uniformity, carrier mobility, composition, crystal structure, sheet resistance, optical properties, stress, and the like. If the materials present within the SIRs are further processed to form simple devices, then additional types of device-based evaluations such as current-voltage behavior, capacitance-voltage behavior, determination of threshold voltage, determination of ON/OFF current ratios, transconductance, and the like, can be applied to the simple devices.

In some embodiments, the step, 1402, (and additional processes as discussed previously) includes the deposition of a gate dielectric material that could be used in a TFT device. In some embodiments, the deposition process is a vacuum-based process such as PVD, ALD, PE-ALD, AVD, UV-ALD, CVD, PECVD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In some embodiments, the step, 1402, (and additional processes as discussed previously) includes the deposition of a metal-based semiconductor (e.g. [X][Y]ZO) material that could be used in a TFT device. In some embodiments, the deposition process is a vacuum-based process such as PVD, ALD, PE-ALD, AVD, UV-ALD, CVD, PECVD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing. In some embodiments, the metal-based semiconductor material includes X—Y—Zn—O (as defined above).

In some embodiments, the step, 1402, (and additional processes as discussed previously) includes the deposition of an etch stop material that could be used in a TFT device. In some embodiments, the deposition process is a vacuum-based process such as PVD, ALD, PE-ALD, AVD, UV-ALD, CVD, PECVD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In some embodiments, the step, 1402, (and additional processes as discussed previously) includes the deposition of a source/drain material that could be used in a TFT device. In some embodiments, the deposition process is a vacuum-based process such as PVD, ALD, PE-ALD, AVD, UV-ALD, CVD, PECVD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a plurality of devices on a substrate in a combinatorial manner, the method comprising:
   providing the substrate, wherein the substrate comprises a plurality of site-isolated regions, and wherein each site-isolated region further comprises one or more gate electrodes formed therein;
   depositing a gate dielectric layer above a surface of each site-isolated region;
   patterning the gate dielectric layer deposited above the surface of each site-isolated region;

depositing a metal-based semiconductor layer above each gate dielectric layer, wherein the metal-based semiconductor layer comprises [X][Y]ZO, wherein [X] and [Y] each comprises one of Al, Ba, C, Ca, Cr, Cu, Fe, K, Mg, Mn, Mo, Na, Ni, Si, Sn, Sr, Ti, V, W, Zn, or Zr;

patterning the metal-based semiconductor layer deposited above each gate dielectric layer;

depositing an etch stop layer above each metal-based semiconductor layer;

patterning the etch stop layer deposited above each metal-based semiconductor layer;

depositing a source/drain layer above each etch stop layer; and patterning the source/drain layer deposited above each etch stop layer, wherein the patterning the metal-based semiconductor layer is varied in the combinatorial manner between at least two of the plurality of site-isolated regions.

2. The method of claim 1 wherein the metal-based semiconductor layer further comprises at least one of Sn, Ti, or N, and wherein [X] and [Y] each comprises one of Ba, C, Ca, Cr, Cu, Fe, K, Mg, Mn, Mo, Na, Ni, Sn, Sr, Ti, V, W, or Zr.

3. The method of claim 1 further comprising evaluating the performance of the thin film transistors formed within each site-isolated region.

4. The method of claim 1 wherein the deposition of the gate dielectric layers comprises at least one of physical vapor deposition, atomic layer deposition, plasma-enhanced atomic layer deposition, atomic vapor deposition, ultra-violet atomic layer deposition, chemical vapor deposition, plasma-enhanced chemical layer deposition, evaporation, printing or spraying of inks, screen printing, inkjet printing, slot die coating, gravure printing, or wet chemical depositions.

5. The method of claim 1 wherein the deposition of the metal-based semiconductor layers comprises at least one of physical vapor deposition, atomic layer deposition, plasma-enhanced atomic layer deposition, atomic vapor deposition, ultra-violet atomic layer deposition, chemical vapor deposition, plasma-enhanced chemical layer deposition, evaporation, printing or spraying of inks, screen printing inkjet printing, slot die coating, gravure printing, or wet chemical depositions.

6. The method of claim 1 wherein the deposition of the etch stop layers comprises at least on of physical vapor deposition, atomic layer deposition, plasma-enhanced atomic layer deposition, atomic vapor deposition, ultra-violet atomic layer deposition, chemical vapor deposition, plasma-enhanced chemical layer deposition, evaporation, printing or spraying of inks, screen printing, inkjet printing, slot die coating, gravure printing, or wet chemical depositions.

7. The method of claim 1 wherein the deposition of the source/drain layers comprises at least one of physical vapor deposition, atomic layer deposition, plasma-enhanced atomic layer deposition, atomic vapor deposition, ultra-violet atomic layer deposition, chemical vapor deposition, plasma-enhanced chemical layer deposition, evaporation, printing or spraying of inks, screen printing, inkjet printing, slot die coating, gravure printing, or wet chemical depositions.

8. The method of claim 1 wherein the patterning of the metal-based semiconductor layers comprises at least one of plasma etching, reactive ion etching, or ion milling.

9. The method of claim 8 wherein the deposition of the metal-based semiconductor layers and the patterning of the metal-based semiconductor layers are performed in the same process chamber.

10. A method for forming a plurality of devices on a substrate in a combinatorial manner, the method comprising:

providing the substrate, wherein the substrate comprises a plurality of gate electrodes formed thereon;

depositing a gate dielectric layer above the gate electrodes;

depositing a metal-based semiconductor layer above each gate dielectric layer, wherein the metal-based semiconductor layer comprises [X][Y]ZO, wherein [X] and [Y] each comprises one of Al, Ba, C, Ca, Cr, Cu, Fe, K, Mg, Mn, Mo, Na, Ni, Si, Sn, Sr, Ti, V, W, Zn, or Zr;

depositing an etch stop layer above the metal-based semiconductor layer;

depositing a source/drain layer above the etch stop layer; and patterning at least one of the gate dielectric layer, the metal-based semiconductor layer, the etch stop layer, or the source/drain layer in the combinatorial manner such that the patterning is varied across a plurality of site-isolated regions on the substrate, wherein depositing the metal-based semiconductor layer is varied such that a gradient in at least one of the material properties of the metal-based semiconductor layer is formed in at least one direction across the substrate.

11. The method of claim 10 wherein the metal-based semiconductor layer further comprises at least one of Sn, Ti or N, and wherein [X] and [Y] each comprises one of Ba, C, Ca, Cr, Cu, Fe, K, Mg, Mn, Mo, Na, Ni, Sn, Sr, Ti, V, W, or Zr.

12. The method of claim 10 further comprising defining the plurality of site-isolated regions on the substrate by removing the layers between the site-isolated regions.

13. The method of claim 12 wherein the defining is at least one of scribing or lithography.

14. The method of claim 12 further comprising evaluating the performance of the thin film transistors formed within each site-isolated region.

15. The method of claim 10 wherein the deposition of the gate dielectric layer comprises at least one of physical vapor deposition, atomic layer deposition, plasma-enhanced atomic layer deposition, atomic vapor deposition, ultra-violet atomic layer deposition, chemical vapor deposition, plasma-enhanced chemical layer deposition, evaporation, printing or spraying of inks, screen printing, inkjet printing, slot die coating, gravure printing, or wet chemical depositions.

16. The method of claim 10 wherein the deposition of the metal-based semiconductor layer comprises at least on of physical vapor deposition, atomic layer deposition, plasma-enhanced atomic layer deposition, atomic vapor deposition, ultra-violet atomic layer deposition, chemical vapor deposition, plasma-enhanced chemical layer deposition, evaporation, printing or spraying of inks, screen printing, inkjet printing, slot die coating, gravure printing, or wet chemical depositions.

17. The method of claim 10 wherein the deposition of the etch stop layer comprises at least one of physical vapor deposition, atomic layer deposition, plasma-enhanced atomic layer deposition, atomic vapor deposition, ultra-violet atomic layer deposition, chemical vapor deposition, plasma-enhanced chemical layer deposition, evaporation, printing or spraying of inks, screen printing, inkjet printing, slot die coating, gravure printing, or wet chemical depositions.

18. The method of claim 10 wherein the deposition of the source/drain layer comprises at least one of physical vapor deposition, atomic layer deposition, plasma-enhanced atomic layer deposition, atomic vapor deposition, ultra-violet atomic layer deposition, chemical vapor deposition, plasma-enhanced chemical layer deposition, evaporation, printing or spraying of inks, screen printing, inkjet printing, slot die coating, gravure printing, or wet chemical depositions.

19. The method of claim 10 wherein the depositing and the patterning of the at least one of the gate dielectric layer, the metal-based semiconductor layer, the etch stop layer, or the source/drain layer are performed in the same process chamber.

20. The method of claim 19 wherein the patterning of the at least one of the gate dielectric layer, the metal-based semiconductor layer, the etch stop layer, or the source/drain layer comprises at least one of plasma etching, reactive ion etching, or ion milling.

* * * * *